US010290615B2

(12) United States Patent
Huska et al.

(10) Patent No.: US 10,290,615 B2
(45) Date of Patent: May 14, 2019

(54) METHOD AND APPARATUS FOR IMPROVED DIRECT TRANSFER OF SEMICONDUCTOR DIE

(71) Applicant: Rohinni, LLC, Coeur d'Alene, ID (US)

(72) Inventors: Andrew Huska, Liberty Lake, WA (US); Cody Peterson, Hayden, ID (US); Clinton Adams, Coeur d'Alene, ID (US); Sean Kupcow, Greenacres, WA (US)

(73) Assignee: Rohinni, LLC, Coeur d'Alene, ID (US)

( * ) Notice: Subject to any disclaimer, the term of this patent is extended or adjusted under 35 U.S.C. 154(b) by 0 days.

(21) Appl. No.: 15/978,091

(22) Filed: May 12, 2018

(65) Prior Publication Data

US 2018/0261579 A1    Sep. 13, 2018

Related U.S. Application Data

(63) Continuation of application No. 15/345,425, filed on Nov. 7, 2016, now Pat. No. 9,985,003, which is a
(Continued)

(51) Int. Cl.
*H01L 21/00*    (2006.01)
*H01L 25/075*    (2006.01)
(Continued)

(52) U.S. Cl.
CPC .... *H01L 25/0753* (2013.01); *G02F 1/133603* (2013.01); *G02F 1/133605* (2013.01);
(Continued)

(58) Field of Classification Search
CPC ......... H01L 21/00; H01L 21/02; H01L 21/48; H01L 21/50; H01L 21/60; H01L 21/66; H01L 21/67; H01L 21/68; H05K 3/30
(Continued)

(56) References Cited

U.S. PATENT DOCUMENTS 3,887,996 A * 6/1975 Hartleroad ........ H01L 21/67144
438/111
4,667,402 A * 5/1987 Wilde ............ H01L 24/86
29/840
(Continued)

FOREIGN PATENT DOCUMENTS

EP    0375293 A2    6/1990
EP    2426398 A1    3/2012
(Continued)

OTHER PUBLICATIONS

Korean Office Action dated Jul. 2, 2018, for the Korean Patent Application No. 10-2017-7026529, a counterpart foreign application of U.S. Pat. No. 9,633,883, 5 pages.
(Continued)

*Primary Examiner* — Xiaoliang Chen
(74) *Attorney, Agent, or Firm* — Lee & Hayes, P.C.

(57) ABSTRACT

A system to effectuate improved transfer of semiconductor die. A first frame secures a first substrate having the semiconductor die. A second frame secures a second substrate adjacent the first substrate. A needle is disposed adjacent to the first frame. The needle includes: a longitudinal surface extending in a direction toward the second frame, and a base end having a cross-sectional dimension being based, at least in part, on a cross-sectional dimension of the semiconductor die. A needle actuator is operably connected to the needle and is configured to actuate the needle such that, during the transfer operation, when the first substrate is secured in the first frame and the second substrate is secured in the second frame, the needle presses the semiconductor die into contact with the second substrate so as to transfer the semiconductor die onto the second substrate.

6 Claims, 13 Drawing Sheets

Related U.S. Application Data continuation of application No. 15/074,994, filed on Mar. 18, 2016, now Pat. No. 9,871,023, which is a continuation of application No. 14/939,896, filed on Nov. 12, 2015, now Pat. No. 9,633,883.

(60) Provisional application No. 62/146,956, filed on Apr. 13, 2015, provisional application No. 62/136,434, filed on Mar. 20, 2015.

(51) Int. Cl.
| | |
|---|---|
| *H01L 21/683* | (2006.01) |
| *H01L 21/48* | (2006.01) |
| *H01L 21/677* | (2006.01) |
| *H01L 21/68* | (2006.01) |
| *H01L 21/687* | (2006.01) |
| *H01L 21/66* | (2006.01) |
| *H01L 23/00* | (2006.01) |
| *H01L 23/544* | (2006.01) |
| *H01L 21/67* | (2006.01) |
| *H01L 33/62* | (2010.01) |
| *G02F 1/1335* | (2006.01) |
| *H01L 23/532* | (2006.01) |

(52) U.S. Cl.
CPC .... *G02F 1/133606* (2013.01); *H01L 21/4853* (2013.01); *H01L 21/67132* (2013.01); *H01L 21/67144* (2013.01); *H01L 21/67196* (2013.01); *H01L 21/67265* (2013.01); *H01L 21/67715* (2013.01); *H01L 21/67778* (2013.01); *H01L 21/681* (2013.01); *H01L 21/6836* (2013.01); *H01L 21/68742* (2013.01); *H01L 22/12* (2013.01); *H01L 22/20* (2013.01); *H01L 23/53242* (2013.01); *H01L 23/544* (2013.01); *H01L 24/75* (2013.01); *H01L 24/83* (2013.01); *H01L 24/89* (2013.01); *H01L 33/62* (2013.01); *G02F 2001/133612* (2013.01); *H01L 24/81* (2013.01); *H01L 2221/68322* (2013.01); *H01L 2221/68327* (2013.01); *H01L 2221/68354* (2013.01); *H01L 2221/68363* (2013.01); *H01L 2221/68381* (2013.01); *H01L 2223/54413* (2013.01); *H01L 2223/54426* (2013.01); *H01L 2223/54433* (2013.01); *H01L 2223/54486* (2013.01); *H01L 2224/16238* (2013.01); *H01L 2224/7531* (2013.01); *H01L 2224/75252* (2013.01); *H01L 2224/75261* (2013.01); *H01L 2224/75262* (2013.01); *H01L 2224/75303* (2013.01); *H01L 2224/75314* (2013.01); *H01L 2224/75317* (2013.01); *H01L 2224/75651* (2013.01); *H01L 2224/75753* (2013.01); *H01L 2224/75824* (2013.01); *H01L 2224/75842* (2013.01); *H01L 2224/75843* (2013.01); *H01L 2224/81191* (2013.01); *H01L 2224/81205* (2013.01); *H01L 2224/81224* (2013.01); *H01L 2224/83224* (2013.01); *H01L 2924/12041* (2013.01); *H01L 2924/405* (2013.01); *H01L 2933/0066* (2013.01)

(58) Field of Classification Search
USPC .......... 174/260; 29/740, 823, 825, 832, 834, 29/840; 438/113, 118, 460; 72/402
See application file for complete search history.

(56) References Cited

U.S. PATENT DOCUMENTS

| | | | |
|---|---|---|---|
| 4,859,267 A | 8/1989 | Knoll | |
| 4,859,269 A * | 8/1989 | Nishiguchi | H05K 13/021 |
| | | | 156/361 |
| 5,105,255 A * | 4/1992 | Shannon | H01L 23/481 |
| | | | 257/499 |
| 5,415,331 A * | 5/1995 | Lin | H01L 21/6838 |
| | | | 228/213 |
| 5,670,429 A * | 9/1997 | Murayama | G01R 31/2893 |
| | | | 264/272.17 |
| 5,951,918 A | 9/1999 | Kuwajima et al. | |
| 5,976,912 A | 11/1999 | Fukutomi et al. | |
| 6,002,180 A | 12/1999 | Akram et al. | |
| 6,080,336 A | 6/2000 | Suehiro et al. | |
| 6,085,573 A | 7/2000 | Larson | |
| 6,091,332 A | 7/2000 | Eberhardt et al. | |
| 6,171,736 B1 | 1/2001 | Hirayanagi | |
| 6,173,750 B1 | 1/2001 | Davis et al. | |
| 6,204,092 B1 * | 3/2001 | Freund | H01L 21/67132 |
| | | | 438/113 |
| 6,207,473 B1 | 3/2001 | Hirai et al. | |
| 6,228,676 B1 | 5/2001 | Glenn et al. | |
| 6,238,597 B1 | 5/2001 | Yim et al. | |
| 6,284,569 B1 | 9/2001 | Sheppard et al. | |
| 6,284,998 B1 | 9/2001 | Sinkunas et al. | |
| 6,319,754 B1 * | 11/2001 | Wang | H01L 21/6835 |
| | | | 257/E21.505 |
| 6,323,659 B1 | 11/2001 | Krahn | |
| 6,352,073 B1 | 3/2002 | Kurosawa et al. | |
| 6,353,202 B1 | 3/2002 | Grotsch et al. | |
| 6,589,809 B1 | 7/2003 | Koopmans | |
| 6,730,933 B1 | 5/2004 | Shimizu et al. | |
| 6,770,961 B2 | 8/2004 | Lee | |
| 6,889,427 B2 * | 5/2005 | Yee | H01L 21/67092 |
| | | | 156/361 |
| 6,961,111 B1 | 11/2005 | Kuramasu | |
| 7,060,593 B2 * | 6/2006 | Kurosawa | H01L 21/67132 |
| | | | 438/110 |
| 7,102,524 B2 | 9/2006 | Arneson et al. | |
| 7,192,843 B2 * | 3/2007 | Kito | H01L 21/67132 |
| | | | 438/458 |
| 7,279,346 B2 | 10/2007 | Andrews et al. | |
| 7,279,347 B2 | 10/2007 | Hon et al. | |
| 7,364,983 B2 * | 4/2008 | Wang | G06K 19/07749 |
| | | | 438/458 |
| 7,445,688 B2 * | 11/2008 | Suzuki | H01L 21/67132 |
| | | | 156/716 |
| 7,510,747 B2 | 3/2009 | Choi et al. | |
| 7,560,303 B2 * | 7/2009 | Wang | G06K 19/07752 |
| | | | 438/107 |
| 7,632,587 B2 | 12/2009 | McLean et al. | |
| 7,637,714 B2 | 12/2009 | Kabeshita et al. | |
| 7,795,076 B2 * | 9/2010 | Arneson | G06K 7/0095 |
| | | | 257/E21.499 |
| 7,857,569 B2 | 12/2010 | Hiroki et al. | |
| 7,886,438 B2 | 2/2011 | Ito et al. | |
| 7,906,787 B2 | 3/2011 | Kang | |
| 8,034,647 B2 | 10/2011 | Batres et al. | |
| 8,110,839 B2 | 2/2012 | Ing et al. | |
| 8,136,231 B2 | 3/2012 | Schiller | |
| 8,142,611 B2 | 3/2012 | Shibata et al. | |
| 8,344,397 B2 | 1/2013 | Lerman et al. | |
| 8,361,840 B2 | 1/2013 | Kerr et al. | |
| 8,415,771 B1 | 4/2013 | Golda et al. | |
| 8,415,879 B2 | 4/2013 | Lowenthal et al. | |
| 8,791,530 B2 | 7/2014 | Bibl et al. | |
| 8,794,501 B2 | 8/2014 | Bibl et al. | |
| 8,835,940 B2 | 9/2014 | Hu et al. | |
| 8,865,489 B2 | 10/2014 | Rogers et al. | |
| 8,928,021 B1 | 1/2015 | Bibl et al. | |
| 8,933,433 B2 | 1/2015 | Higginson et al. | |
| 8,948,905 B2 | 2/2015 | Prakapenka et al. | |
| 8,998,068 B2 | 4/2015 | Park et al. | |
| 9,000,470 B2 | 4/2015 | Tudorica et al. | |
| 9,000,566 B2 | 4/2015 | Golda et al. | |
| 9,069,128 B2 | 6/2015 | Kuroda et al. | |
| 9,082,936 B2 | 7/2015 | Baldridge et al. | |
| 9,087,764 B2 | 7/2015 | Chan et al. | |
| 9,099,568 B2 | 8/2015 | Blanchard | |
| 9,105,714 B2 | 8/2015 | Hu et al. | |
| 9,136,161 B2 | 9/2015 | Bibl et al. | |
| 9,142,535 B2 | 9/2015 | Oraw | |

(56) References Cited

U.S. PATENT DOCUMENTS

| | | |
|---|---|---|
| 9,153,171 B2 | 10/2015 | Sakariya et al. |
| 9,159,707 B2 | 10/2015 | Cope |
| 9,166,114 B2 | 10/2015 | Hu et al. |
| 9,166,126 B2 | 10/2015 | Donofrio et al. |
| 9,217,541 B2 | 12/2015 | Bathurst et al. |
| 9,224,629 B2 | 12/2015 | Golda et al. |
| 9,229,597 B2 | 1/2016 | Oraw |
| 9,236,815 B2 | 1/2016 | Golda et al. |
| 9,255,001 B2 | 2/2016 | Golda et al. |
| 9,288,899 B2 | 3/2016 | Golda et al. |
| 9,296,111 B2 | 3/2016 | Bibl et al. |
| 9,308,649 B2 | 4/2016 | Golda et al. |
| 9,314,930 B2 | 4/2016 | Golda et al. |
| 9,318,475 B2 | 4/2016 | Bibl et al. |
| 9,324,692 B2 | 4/2016 | Lowenthal et al. |
| 9,324,693 B2 | 4/2016 | Oraw et al. |
| 9,368,549 B1 | 6/2016 | Oraw et al. |
| 9,370,864 B2 | 6/2016 | Bibl et al. |
| 9,379,092 B2 | 6/2016 | Hu et al. |
| 9,391,042 B2 | 7/2016 | Golda et al. |
| 9,418,979 B2 | 8/2016 | Karlicek, Jr. et al. |
| 9,425,151 B2 | 8/2016 | Golda et al. |
| 9,450,043 B2 | 9/2016 | Nuzzo et al. |
| 9,490,407 B2 | 11/2016 | Ray et al. |
| 9,508,694 B2 | 11/2016 | Oraw et al. |
| 9,570,427 B2 | 2/2017 | Bibl et al. |
| 9,583,466 B2 | 2/2017 | McGroddy et al. |
| 9,583,533 B2 | 2/2017 | Hu et al. |
| 9,595,638 B2 | 3/2017 | Ahn et al. |
| 9,633,883 B2 | 4/2017 | Huska et al. |
| 9,666,764 B2 | 5/2017 | Bergmann et al. |
| 2001/0047225 A1 | 11/2001 | Shimoike et al. |
| 2002/0043923 A1 | 4/2002 | Natori |
| 2002/0102760 A1 | 8/2002 | Gottfried |
| 2002/0149092 A1 | 10/2002 | Lee |
| 2003/0153099 A1 | 8/2003 | Jiang et al. |
| 2003/0230799 A1 | 12/2003 | Yee et al. |
| 2004/0020037 A1* | 2/2004 | Arneson ........... G06K 19/07718 29/825 |
| 2004/0020039 A1* | 2/2004 | Arneson ........... G06K 19/07718 29/825 |
| 2004/0020040 A1* | 2/2004 | Arneson ........... G06K 19/07718 29/825 |
| 2004/0239861 A1 | 12/2004 | Uchida |
| 2004/0250417 A1* | 12/2004 | Arneson ............... G06K 7/0095 29/832 |
| 2005/0007516 A1 | 1/2005 | Hong et al. |
| 2005/0009244 A1 | 1/2005 | Shiobara et al. |
| 2005/0015970 A1* | 1/2005 | Arneson ............... G06K 7/0095 29/601 |
| 2005/0057906 A1 | 3/2005 | Nakatani et al. |
| 2005/0101052 A1 | 5/2005 | Kobayashi et al. |
| 2005/0115602 A1 | 6/2005 | Senta et al. |
| 2005/0155792 A1 | 7/2005 | Ito et al. |
| 2005/0253161 A1 | 11/2005 | Horio et al. |
| 2006/0002146 A1 | 1/2006 | Baba |
| 2006/0076690 A1 | 4/2006 | Khandros et al. |
| 2006/0145125 A1 | 7/2006 | Kuwajima et al. |
| 2006/0180344 A1 | 8/2006 | Ito et al. |
| 2006/0181600 A1 | 8/2006 | Bourdelais et al. |
| 2006/0225273 A1* | 10/2006 | Arneson ............... H05K 13/046 29/834 |
| 2007/0086211 A1 | 4/2007 | Beeson et al. |
| 2007/0095791 A1 | 5/2007 | Shinozaki et al. |
| 2007/0131016 A1* | 6/2007 | Addison ........... H01L 21/67144 72/402 |
| 2007/0138494 A1 | 6/2007 | Pugh et al. |
| 2007/0152577 A1 | 7/2007 | Cho et al. |
| 2007/0164260 A1 | 7/2007 | Kuwajima |
| 2007/0171651 A1 | 7/2007 | Park et al. |
| 2007/0263190 A1 | 11/2007 | De Boeij et al. |
| 2008/0005895 A1 | 1/2008 | Aoyama et al. |
| 2008/0032484 A1 | 2/2008 | Diep et al. |
| 2008/0118681 A1 | 5/2008 | Ueno |
| 2008/0124842 A1* | 5/2008 | Wang ............... G06K 19/07752 438/118 |
| 2008/0145968 A1 | 6/2008 | Hiew et al. |
| 2008/0185972 A1 | 8/2008 | Ito |
| 2008/0267745 A1 | 10/2008 | Schiller |
| 2009/0030312 A1 | 1/2009 | Hadjicostis |
| 2009/0032295 A1 | 2/2009 | Okajima et al. |
| 2009/0039376 A1 | 2/2009 | Uemoto et al. |
| 2009/0065588 A1 | 3/2009 | Aoki et al. |
| 2009/0090468 A1 | 4/2009 | Murayama |
| 2009/0095963 A1 | 4/2009 | Daniels |
| 2009/0096413 A1 | 4/2009 | Partovi et al. |
| 2009/0217522 A1 | 9/2009 | Ito et al. |
| 2009/0283220 A1 | 11/2009 | Chen |
| 2010/0044845 A1 | 2/2010 | Funaya et al. |
| 2010/0073597 A1 | 3/2010 | Bierhuizen et al. |
| 2010/0075459 A1 | 3/2010 | Kerr et al. |
| 2010/0200898 A1 | 8/2010 | Lin et al. |
| 2010/0246152 A1 | 9/2010 | Lin et al. |
| 2011/0034912 A1 | 2/2011 | de Graff et al. |
| 2011/0089443 A1 | 4/2011 | Hsu |
| 2011/0120761 A1 | 5/2011 | Kawai |
| 2011/0123796 A1 | 5/2011 | Auman et al. |
| 2011/0175518 A1 | 7/2011 | Reed et al. |
| 2011/0180137 A1 | 7/2011 | Iwamuro et al. |
| 2011/0180138 A1 | 7/2011 | Adachi et al. |
| 2011/0209751 A1 | 9/2011 | Nojiri et al. |
| 2011/0232082 A1 | 9/2011 | Kim et al. |
| 2011/0277831 A1 | 11/2011 | Yoshida et al. |
| 2011/0315956 A1 | 12/2011 | Tischler et al. |
| 2011/0317417 A1 | 12/2011 | Gourlay |
| 2012/0049204 A1 | 3/2012 | Lai |
| 2012/0070570 A1 | 3/2012 | Kim et al. |
| 2012/0156814 A1 | 6/2012 | Hsieh et al. |
| 2012/0157804 A1 | 6/2012 | Rogers et al. |
| 2012/0165759 A1 | 6/2012 | Rogers et al. |
| 2012/0193662 A1 | 8/2012 | Donofrio et al. |
| 2012/0224111 A1 | 9/2012 | Ohshima |
| 2012/0247817 A1 | 10/2012 | Hommura et al. |
| 2012/0292086 A1 | 11/2012 | Auman et al. |
| 2012/0320581 A1 | 12/2012 | Rogers et al. |
| 2013/0037838 A1 | 2/2013 | Speier et al. |
| 2013/0041235 A1 | 2/2013 | Rogers et al. |
| 2013/0056749 A1 | 3/2013 | Tischler et al. |
| 2013/0062637 A1 | 3/2013 | Reed et al. |
| 2013/0119538 A1 | 5/2013 | McCarthy |
| 2013/0208026 A1 | 8/2013 | Suzuki et al. |
| 2013/0264592 A1 | 10/2013 | Bergmann et al. |
| 2013/0271959 A1 | 10/2013 | Woodgate et al. |
| 2013/0294006 A1 | 11/2013 | Kang et al. |
| 2013/0309792 A1 | 11/2013 | Tischler et al. |
| 2014/0062316 A1 | 3/2014 | Tischler et al. |
| 2014/0065741 A1 | 3/2014 | Chern et al. |
| 2014/0071413 A1 | 3/2014 | Takakuwa |
| 2014/0091337 A1 | 4/2014 | Ooyabu et al. |
| 2014/0094878 A1 | 4/2014 | Gossler et al. |
| 2014/0098557 A1 | 4/2014 | Veerasamy |
| 2014/0104850 A1 | 4/2014 | Yamamoto et al. |
| 2014/0110859 A1 | 4/2014 | Rafferty et al. |
| 2014/0130340 A1 | 5/2014 | Li et al. |
| 2014/0159072 A1 | 6/2014 | Ooyabu et al. |
| 2014/0167611 A1 | 6/2014 | Tischler et al. |
| 2014/0199635 A1 | 7/2014 | Hirano et al. |
| 2014/0264407 A1 | 9/2014 | Tischler et al. |
| 2014/0303452 A1 | 10/2014 | Ghaffari |
| 2014/0355251 A1 | 12/2014 | Kahrs et al. |
| 2015/0023023 A1 | 1/2015 | Livesay et al. |
| 2015/0034989 A1 | 2/2015 | Namiki et al. |
| 2015/0037517 A1 | 2/2015 | Buriak et al. |
| 2015/0054003 A1 | 2/2015 | Oraw |
| 2015/0204490 A1 | 7/2015 | Zheng et al. |
| 2015/0262729 A1 | 9/2015 | Aoki et al. |
| 2015/0308632 A1 | 10/2015 | Ueno et al. |
| 2015/0332635 A1 | 11/2015 | Lau et al. |
| 2015/0364633 A1 | 12/2015 | Hosomi et al. |
| 2015/0370130 A1 | 12/2015 | Lin |
| 2015/0371585 A1 | 12/2015 | Bower et al. |
| 2016/0026846 A1 | 1/2016 | Lin et al. |
| 2016/0066789 A1 | 3/2016 | Rogers et al. |

(56) References Cited

U.S. PATENT DOCUMENTS

| | | |
|---|---|---|
| 2016/0172562 A1 | 6/2016 | Voutsas |
| 2016/0211415 A1 | 7/2016 | Huang et al. |
| 2016/0218264 A1 | 7/2016 | Tischler et al. |
| 2016/0233269 A1 | 8/2016 | Choi et al. |
| 2016/0267836 A1 | 9/2016 | Meersman et al. |
| 2016/0275205 A1 | 9/2016 | Lehavi et al. |
| 2016/0276195 A1 | 9/2016 | Huska et al. |
| 2016/0276205 A1 | 9/2016 | Huska et al. |
| 2017/0005077 A1 | 1/2017 | Kim et al. |
| 2017/0053901 A1 | 2/2017 | Huska et al. |
| 2017/0062400 A1 | 3/2017 | Li et al. |
| 2017/0062683 A1 | 3/2017 | Chen et al. |
| 2017/0140959 A1 | 5/2017 | Huska et al. |
| 2017/0140967 A1 | 5/2017 | Huska et al. |
| 2017/0150602 A1 | 5/2017 | Johnston et al. |
| 2017/0188427 A1 | 6/2017 | Cok et al. |
| 2017/0194171 A1 | 7/2017 | Peterson et al. |
| 2017/0256523 A1 | 9/2017 | Huska et al. |
| 2017/0256524 A1 | 9/2017 | Huska et al. |
| 2017/0269430 A1 | 9/2017 | Peterson et al. |
| 2017/0365586 A1 | 12/2017 | Huska et al. |
| 2018/0053752 A1 | 2/2018 | Huska et al. |
| 2018/0122673 A1 | 5/2018 | Wendt et al. |
| 2018/0141163 A1 | 5/2018 | Wendt et al. |
| 2018/0204749 A1 | 7/2018 | Huska et al. |
| 2018/0233495 A1 | 8/2018 | Peterson et al. |
| 2018/0248090 A1 | 8/2018 | Huska et al. |
| 2018/0261580 A1 | 9/2018 | Huska et al. |
| 2018/0261581 A1 | 9/2018 | Huska et al. |
| 2018/0269086 A1 | 9/2018 | Huska et al. |
| 2018/0286838 A1 | 10/2018 | Huska et al. |
| 2018/0301439 A1 | 10/2018 | Peterson et al. |

FOREIGN PATENT DOCUMENTS

| | | |
|---|---|---|
| JP | 10294493 | 11/1998 |
| JP | 2009101762 | 5/2009 |
| JP | WO2011111293 | 6/2013 |
| RU | 2331951 C1 | 8/2008 |
| WO | WO2007011068 A1 | 1/2007 |
| WO | WO2008012460 A2 | 1/2008 |
| WO | WO2012148231 A2 | 11/2012 |
| WO | WO2016069766 A1 | 5/2016 |
| WO | WO2016154956 A1 | 10/2016 |
| WO | WO2016183844 A1 | 11/2016 |
| WO | WO2016183845 A1 | 11/2016 |
| WO | WO2017008253 A1 | 1/2017 |
| WO | WO2017028206 A1 | 2/2017 |
| WO | WO2017028207 A1 | 2/2017 |

OTHER PUBLICATIONS

Extended European Search Report dated Sep. 19, 2018 for European Application No. 16769455.3, 9 pages.
Office Action for U.S. Appl. No. 15/951,094, dated Oct. 11, 2018, Peterson et al., "Substrate With Array of LEDs for Backlighting a Display Device", 13 pages.
Office Action for U.S. Appl. No. 16/013,755, dated Oct. 25, 2018, Peterson et al, "Substrate with Array of LEDs for Backlighting a Display Device", 12 pages.
Office Action for U.S. Appl. No. 15/444,013, dated Oct. 4, 2018, Huska et al, "Semiconductor Device Circuit Apparatus Bonded with Anisotropic Conductive Film and Method of Direct Transfer for Making the Same", 15 pages.
Office action for U.S. Appl. No. 15/409,409, dated Oct. 5, 2017, Huska et al., "Flexible Support Substrate for Transfer of Semiconductor Devices", 10 pages.
Office Action for U.S. Appl. No. 15/984,126, dated Aug. 14, 2018, Andrew Huska, "Support Substrate for Transfer of Semiconductor Devices", 10 pages.
Office Action for U.S. Appl. No. 15/978,092, dated Aug. 30, 2018, Andrew Huska, "Apparatus for Direct Transfer of Semiconductor Devices With Needle Retraction Support", 14 pages.
"Capillaries 1572& 1572N Series", Gaisef precision bonding tools, coorstek.com, Nov. 23, 2016, 1 page.
Extended European Search Report dated Feb. 2, 2018 for European Patent Application No. 15803526.1, 6 pages.
Office action for U.S. Appl. No. 14/939,896, dated Jul. 5, 2016, Huska et al., "Method and Apparatus for Transfer of Semiconductor Devices", 9 pages.
Office action for U.S. Appl. No. 15/074,994, dated Oct. 3, 2016, Huska et al., "Method for Transfer of Semiconductor Devices", 10 pages.
Office action for U.S. Appl. No. 15/345,425, dated Nov. 21, 2017, Huska et al., "Substrate With Array of LEDs for Backlighting a Display Device", 14 pages.
Office Action for U.S. Appl. No. 15/444,013, dated Mar. 22, 2018, Huska et al., "Semiconductor Device Circuit Apparatus Bonded with Anisotropic Conductive Film and Method of Direct Transfer for Making the Same", 16 pages.
Office Action for U.S. Appl. No. 15/479,063, dated Apr. 19, 2018, Peterson, "Method and Apparatus for Light Diffusion", 12 pages.
Office action for U.S. Appl. No. 15/345,425, dated Aug. 11, 2017, Huska et al., "Substrate With Array of LEDs for Backlighting a Display Device", 12 pages.
PCT Search Report and Written Opinion dated Aug. 14, 2017 for PCT Application No. PCT/US17/23061, 10 pages.
Office action for U.S. Appl. No. 15/075,001, dated Aug. 18, 2016, Peterson et al., "Method and Apparatus for Light Diffusion", 13 pages.
Office Action for U.S. Appl. No. 15/479,063, dated Sep. 11, 2017, Peterson, "Method and Apparatus for Light Diffusion", 11 pages.
Office Action for U.S. Appl. No. 15/444,013, dated Sep. 20, 2017, Huska et al., "Semiconductor Device Circuit Apparatus Bonded with Anisotropic Conductive Film and Method of Direct Transfer for Making the Same", 36 pages.
PCT Search Report and Written Opinion dated May 10, 2018 for PCT application No. PCT/US2018/014256, 7 pages.
PCT Search Report and Written Opinion dated Dec. 10, 2015 for PCT application No. PCT/US2015/034596, 9 pages.
PCT Search Report and Written Opinion dated Mar. 15, 2018 for PCT application No. PCT/US2017/062968, 7 pages.
PCT Search Report and Written Opinion dated Apr. 12, 2018 for PCT Application No. PCT/US17/62981, 7 pages.
PCT Search Report and Written Opinion dated May 4, 2018 for PCT Application No. PCT/US18/19773, 7 pages.
PCT Search Report and Written Opinion dated Jun. 2, 2016 for PCT application No. PCT/US2016/023280, 7 pages.
Chinese Office Action dated Oct. 9, 2018, for Chinese Patent Application No. 201580037905.9, a counterpart foreign applicaiton of U.S. Appl. No. 15/316,505, 9 Pages.
Korean Office Action dated Nov. 26, 2018 for Korean Patent Application No. 10-2017-7000397, a counterpart of U.S. Appl. No. 15/316,505, 20 pages.
Final Office Action dated Jan. 14, 2019 for U.S. Appl. No. 15/796,533 "Apparatus for Multi-Direct Transfer of Semiconductors" Huska, 17 pages.
Office Action for U.S. Appl. No. 15/951,094, dated Jan. 28, 2019, Peterson et al., "Substrate With Array of LEDs for Backlighting a Display Device", 15 pages.
Office Action for U.S. Appl. No. 15/316,505, dated Nov. 16, 2018, Peterson et al, "Manufacture of Circuit Assembly with Unpackaged Semiconductor Devices", 22 pages.

* cited by examiner

METHOD AND APPARATUS FOR IMPROVED DIRECT TRANSFER OF SEMICONDUCTOR DIE

CROSS REFERENCE TO RELATED PATENT APPLICATIONS

This application is a continuation of and claims priority to U.S. patent application Ser. No. 15/345,425, filed on Nov. 7, 2016, entitled "Substrate with Array of LEDs for Backlighting a Display Device," which is a continuation of and claims priority to U.S. patent application Ser. No. 15/074,994, filed on Mar. 18, 2016, entitled "Method for Transfer of Semiconductor Devices," which is now patented as U.S. Pat. No. 9,871,023, and which is a continuation of and claims priority to U.S. patent application Ser. No. 14/939,896, filed on Nov. 12, 2015, entitled "Apparatus for Transfer of Semiconductor Devices," which is now patented as U.S. Pat. No. 9,633,883, and which claims priority to U.S. Provisional Patent Application No. 62/146,956, filed on Apr. 13, 2015, and to U.S. Provisional Patent Application No. 62/136,434, filed on Mar. 20, 2015, which applications are hereby incorporated in their entireties by reference.

BACKGROUND

Semiconductor devices are electrical components that utilize semiconductor material, such as silicon, germanium, gallium arsenide, and the like. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, and the like.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, unpackaged semiconductor devices may be called semiconductor device die, or just "die" for simplicity. As used herein, "semiconductor device die" or "die" may refer to both singular and plurality forms. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die are then "packaged" via a conventional fabrication process discussed briefly below. The actions between the wafer handling and the packaging may be referred to as "die preparation."

In some instances, the die preparation may include sorting the die via a "pick and place process," whereby diced die are picked up individually and sorted into bins. The sorting may be based on the forward voltage capacity of the die, the average power of the die, and/or the wavelength of the die.

Typically, the packaging involves mounting a die into a plastic or ceramic package (e.g., mold or enclosure). The packaging also includes connecting the die contacts to pins/wires for interfacing/interconnecting with ultimate circuitry. The packaging of the semiconductor device is typically completed by sealing the die to protect it from the environment (e.g., dust).

A product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Figure 1:
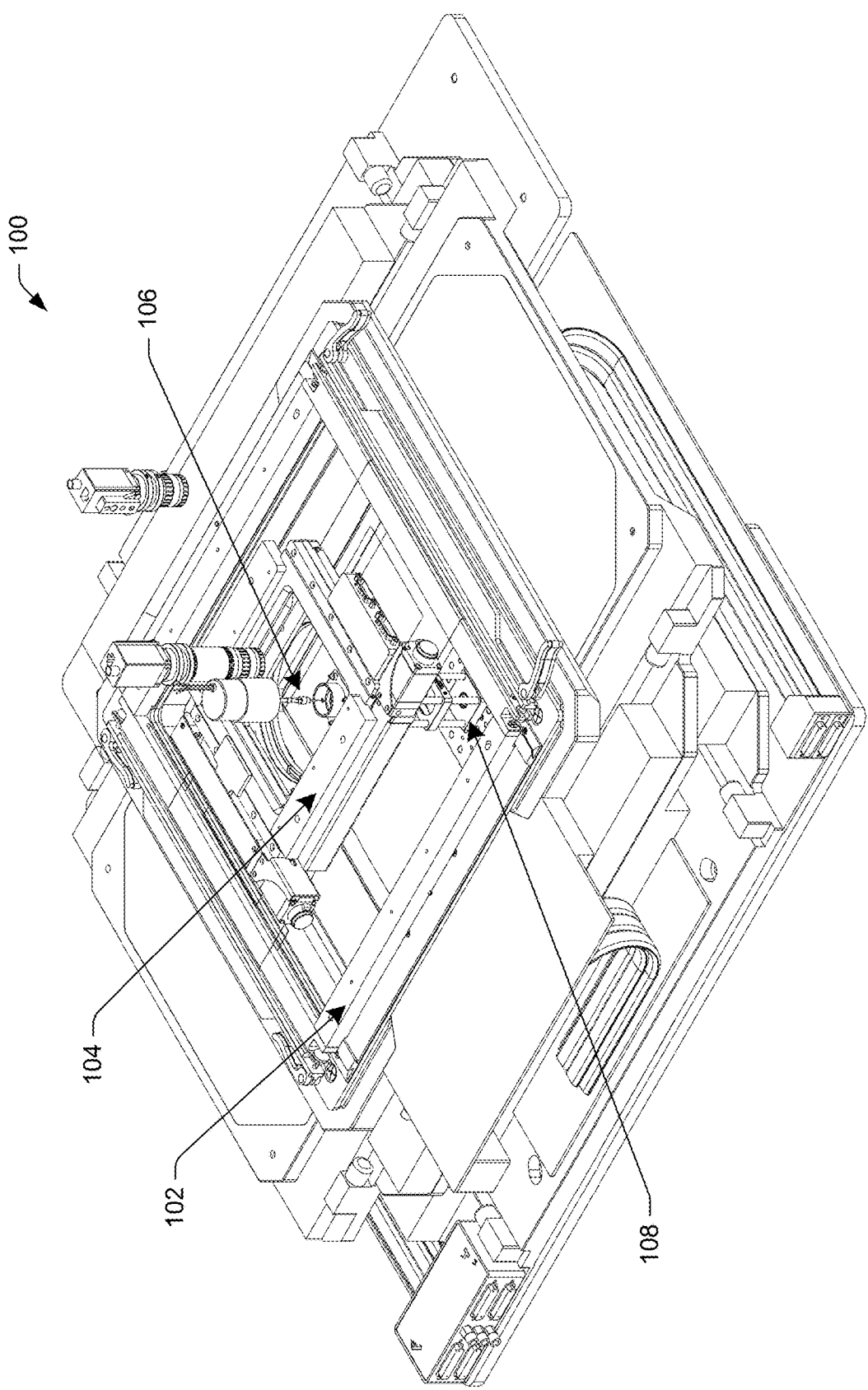
FIG. 1 illustrates an isometric view of an embodiment of a transfer apparatus.

This disclosure is directed to a machine that directly transfers and affixes semiconductor device die to a circuit and to the process for achieving the same, as well as to the circuit having die affixed thereto (as the output product). In some instances, the machine functions to transfer unpackaged die directly from a substrate such as a "wafer tape" to a product substrate, such as a circuit substrate. The direct transfer of unpackaged die may significantly reduce the thickness of an end product compared to a similar product produced by conventional means, as well as the amount of time and/or cost to manufacture the product substrate.

For the purpose of this description, the term "substrate" refers to any substance on which, or to which, a process or action occurs. Further, the term "product" refers to the desired output from a process or action, regardless of the state of completion. Thus, a product substrate refers to any substance on which, or to which, a process or action is caused to occur for a desired output.

In an embodiment, the machine may secure a product substrate for receiving "unpackaged" die, such as LEDs, transferred from the wafer tape, for example. In an effort to reduce the dimensions of the products using the die, the die are very small and thin, for example, a die may be about 50 microns thick. Due to the relatively small size of the die, the machine includes components that function to precisely align both the wafer tape carrying the die and the product substrate to ensure accurate placement and/or avoid product material waste. In some instances, the components that align the product substrate and the die on the wafer tape may include a set of frames in which the wafer tape and the product substrate are secured respectively and conveyed individually to a position of alignment such that a specific die on the wafer tape is transferred to a specific spot on the product substrate.

The frame that conveys the product substrate may travel in various directions, including horizontal directions and/or vertical directions, or even directions that would permit transfer to a curved surface. The frame that conveys the wafer tape may travel in various directions also. A system of gears, tracks, motors, and/or other elements may be used to secure and convey the frames carrying the product substrate and the wafer tape respectively to align the product substrate with the wafer tape in order to place a die on the correct position of the product substrate. Each frame system may also be moved to an extraction position in order to facilitate extraction of the wafer tape and the product substrate upon completion of the transfer process.

In some instances, the machine may further include a transfer mechanism for transferring the die directly from the wafer tape to the product substrate without "packaging" the die. The transfer mechanism may be disposed vertically above the wafer tape so as to press down on the die via the wafer tape toward the product substrate. This process of pressing down on the die may cause the die to peel off of the wafer tape, starting at the sides of the die until the die separate(s) from the wafer tape to be attached to the product substrate. That is, by reducing the adhesion force between the die and the wafer tape, and increasing the adhesion force between the die and the product substrate, the die may be transferred.

In some embodiments, the transfer mechanism may include an elongated rod, such as a pin or needle that may be cyclically actuated against the wafer tape to push the wafer tape from a top side. The needle may be sized so as to be no wider than a width of the die being transferred. Although in other instances, the width of the needle may wider, or any other dimension. When the end of the needle contacts the wafer tape, the wafer tape may experience a local deflection at the area between the die and the wafer tape. Inasmuch as the deflection is highly localized and rapidly performed, the portion of the wafer tape that does not receive pressure from the needle may begin to flex away from the surface of the die. This partial separation may thus cause the die to lose sufficient contact with the wafer tape, so as to be released from the wafer tape. Moreover, in some instances, the deflection of the wafer tape may be so minimal, as to maintain an entirety of the surface area of the die in contact with the wafer tape, while still causing the opposing surface of the die to extend beyond a plane of extension of the corresponding surface of the adjacent die to avoid unintentional transfer of adjacent die.

Alternatively, or additionally, the machine may further include a fixing mechanism for affixing the separated, "unpackaged" die to the product substrate. In some instances, the product substrate may have thereon a circuit trace to which the die is/are transferred and affixed. The fixing mechanism may include a device that emits energy, such as a laser, to melt/soften the material of the circuit trace on the product substrate. Moreover, in some instances, the laser may be used to activate/harden the material of the circuit trace. Thus, the fixing mechanism may be actuated before, and/or after the die is in contact with the material of the circuit trace. Accordingly, upon actuation of the transfer mechanism to release a die onto the product substrate, the energy emitting device may also be activated so as to prepare the trace material to receive the die. The activation of the energy emitting device may further enhance the release and capture of the die from the wafer tape so as to begin formation of a semiconductor product on the product substrate.

First Example Embodiment of a Direct Transfer Apparatus

FIG. 1 illustrates an embodiment of an apparatus 100 that may be used to directly transfer unpackaged semiconductor components (or "die") from a wafer tape to a product substrate. The wafer tape may also be referred to herein as the semiconductor device die substrate, or simply a die substrate. The apparatus 100 may include a product substrate conveyance mechanism 102 and a wafer tape conveyance mechanism 104. Each of the product substrate conveyance mechanism 102 and the wafer tape conveyance mechanism 104 may include a frame system or other means to secure the respective substrates to be conveyed to desired alignment positions with respect to each other. The apparatus 100 may further include a transfer mechanism 106, which, as shown, may be disposed vertically above the wafer tape conveyance mechanism 104. In some instances, the transfer mechanism 106 may be located so as to nearly contact the wafer substrate. Additionally, the apparatus 100 may include a fixing mechanism 108. The fixing mechanism 108 may be disposed vertically beneath the product substrate conveyance mechanism 102 in alignment with the transfer mechanism 106 at a transfer position, where a die may be placed on the product substrate. As discussed below, FIGS. 2A and 2B illustrate example details of the apparatus 100.

Figure 2A:
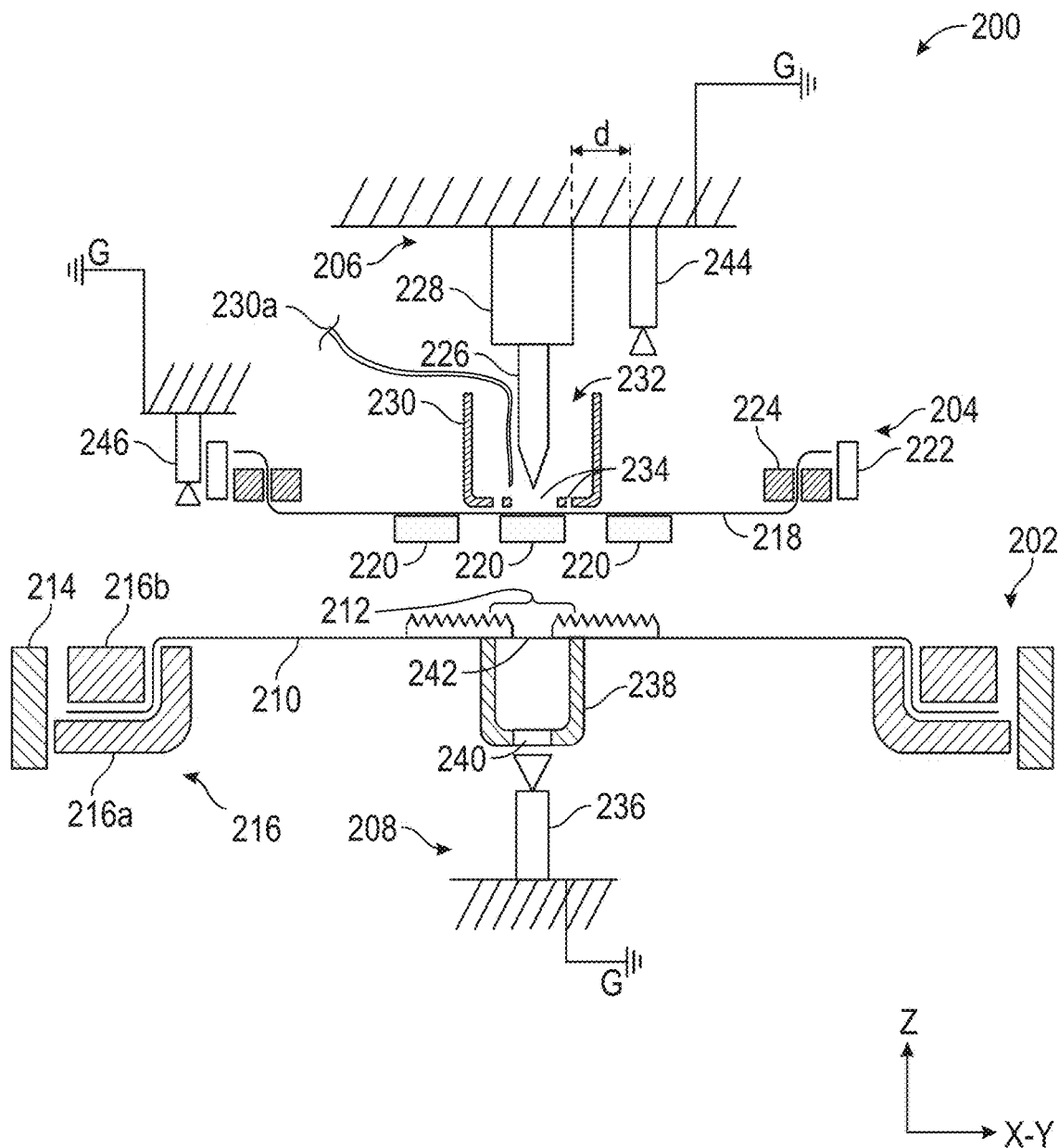
FIG. 2A represents a schematic view of an embodiment of a transfer apparatus in a pre-transfer position.
Figure 2B:
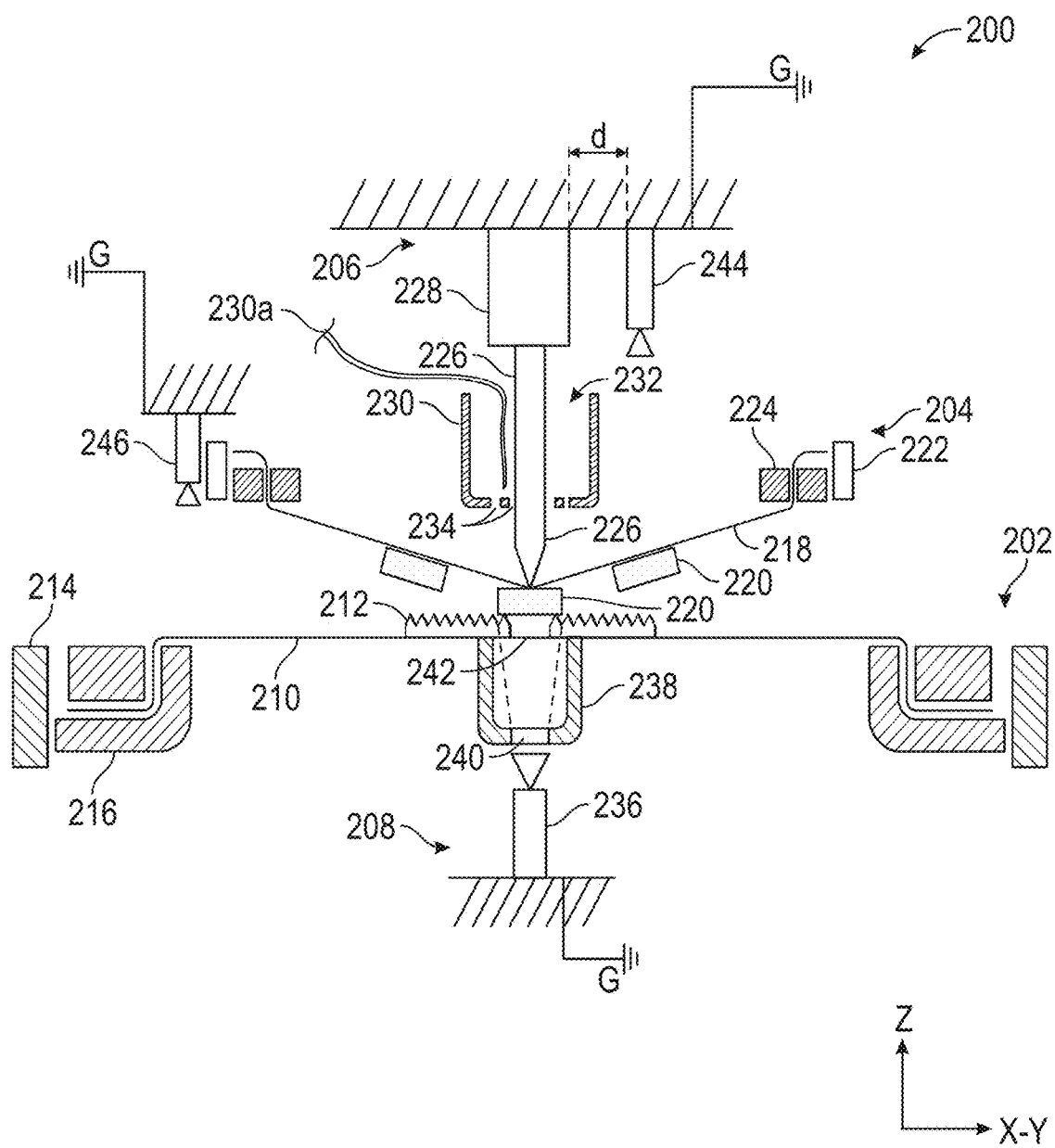
FIG. 2B represents a schematic view of an embodiment of a transfer apparatus in a transfer position.

Inasmuch as FIGS. 2A and 2B depict different stages of the transfer operation, while referring to the same elements and features of apparatus 200, the following discussion of specific features may refer interchangeably to either or both of FIGS. 2A and 2B, except where explicitly indicated. In particular, FIGS. 2A and 2B illustrate an embodiment of an apparatus 200, including a product substrate conveyance mechanism 202, a wafer tape conveyance mechanism 204, a transfer mechanism 206, and a fixing mechanism 208. The product substrate conveyance mechanism 202 may be disposed adjacent to the wafer tape conveyance mechanism 204. For example, as illustrated, the product substrate conveyance mechanism 202 may extend in a substantially horizontal direction and may be disposed vertically beneath the wafer tape conveyance mechanism 204 so as to take advantage of any effect that gravity may have in the transfer process. Alternatively, the product substrate conveyance mechanism 202 may be oriented so as to extend transversely to a horizontal plane.

During a transfer operation, the conveyance mechanisms 202, 204 may be positioned such that a space between a surface of a product substrate carried by the product substrate conveyance mechanism 202 and a surface of a wafer tape carried by the wafer tape conveyance mechanism 204 may be more or less than 1 mm, depending on various other aspects of the apparatus 200, including the amount of deflection that occurs by components during the transfer operation, as described herein below. In some instances, the respective opposing surfaces of the wafer tape and the product substrate may be the most prominent structures in comparison to the supporting structures of the conveyance mechanisms 202, 204. That is, in order to avoid a collision between components of the machine and products thereon, which might be caused by movable parts (e.g., the conveyance mechanisms 202, 204), a distance between the respective surfaces of the wafer tape and product substrate may be less than a distance between either of the surfaces and any other opposing structural component.

As depicted, and in some instances, the transfer mechanism 206 may be disposed vertically above the wafer tape conveyance mechanism 204, and the fixing mechanism 208 may be disposed vertically beneath the product substrate conveyance mechanism 202. It is contemplated that in some embodiments, one or both of the transfer mechanism 206 and the fixing mechanism 208 may be oriented in different positions than the positions illustrated in FIGS. 2A and 2B. For example, the transfer mechanism 206 may be disposed so as to extend at an acute angle with respect to a horizontal plane. In another embodiment, the fixing mechanism 208 may be oriented to emit energy during the transfer process from the same direction of actuation as the transfer mechanism 206, or alternatively, from any orientation and position from which the fixing mechanism 208 is able to participate in the transfer process.

The product substrate conveyance mechanism 202 may be used to secure a product substrate 210. Herein, the term "product substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to, a silicone, an acrylic, a polyester, a polycarbonate, etc.; a circuit board (such as a printed circuit board (PCB)); a string or thread circuit, which may include a pair of conductive wires or "threads" extending in parallel; and a cloth material of cotton, nylon, rayon, leather, etc. The choice of material of the product substrate may include durable materials, flexible materials, rigid materials, and other materials with which the transfer process is successful and which maintain suitability for the end use of the product substrate. The product substrate 210 may be formed solely or at least partially of conductive material such that the product substrate 210 acts as a conductive circuit for forming a product. The potential types of product substrate may further include items, such as glass bottles, vehicle windows, or sheets of glass.

In an embodiment as depicted in FIGS. 2A and 2B, the product substrate 210 may include a circuit trace 212 disposed thereon. The circuit trace 212, as depicted, may include a pair of adjacent trace lines spaced apart by a trace spacing, or gap so as to accommodate a distance between electrical contact terminals (not shown) on the die being transferred. Thus, the trace spacing, or gap between the adjacent trace lines of the circuit trace 212 may be sized according to the size of the die being transferred to ensure proper connectivity and subsequent activation of the die. For example, the circuit trace 212 may have a trace spacing, or gap ranging from about 75 to 200 microns, about 100 to 175 microns, or about 125 to 150 microns.

The circuit trace 212 may be formed from a conductive ink disposed via screen printing, inkjet printing, laser printing, manual printing, or other printing means. Further, the circuit trace 212 may be pre-cured and semi-dry or dry to provide additional stability, while still being activatable for die conductivity purposes. A wet conductive ink may also be used to form the circuit trace 212, or a combination of wet and dry ink may be used for the circuit trace 212. Alternatively, or additionally, the circuit trace 212 may be pre-formed as a wire trace, or photo-etched, or from molten material formed into a circuit pattern and subsequently adhered, embedded, or otherwise secured to the product substrate 210.

The material of the circuit trace 212 may include, but is not limited to, silver, copper, gold, carbon, conductive polymers, etc. In some instances, the circuit trace 212 may include a silver-coated copper particle. A thickness of the circuit trace 212 may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

Accordingly, in one non-limiting example, the product substrate 210 may be a flexible, translucent polyester sheet having a desired circuit pattern screen printed thereon using a silver-based conductive ink material to form the circuit trace 212.

The product substrate conveyance mechanism 202 may include a product substrate conveyor frame 214 for securing a product substrate holder frame 216. The structure of the product substrate holder frame 216 may vary significantly depending on the type and properties (e.g., shape, size, elasticity, etc.) of the product substrate being used. Inasmuch as the product substrate 210 may be a flexible material, product substrate 210 may be held under tension in the product substrate holder frame 216, so as to create a more rigid surface upon which a transfer operation, discussed herein below, is performed. In the above example, the rigidity created by the tension in the product substrate 210 may increase the placement accuracy when transferring components.

In some instances, using a durable or more rigid material for the product substrate 210, naturally provides a firm surface for component placement accuracy. In contrast, when the product substrate 210 is allowed to sag, wrinkles and/or other discontinuities may form in the product substrate 210 and interfere with the pre-set pattern of the circuit trace 212, to the extent that the transfer operation may be unsuccessful.

While the means of holding the product substrate 210 may vary greatly, FIG. 2A illustrates an embodiment of a product substrate holder frame 216 including a first portion 216a having a concave shape and a second portion 216b having a convex counter shape that corresponds in shape to the concave shape. In the depicted example, tension is created for the product substrate 210 by inserting an outer perimeter of the product substrate 210 between the first portion 216a and the second portion 216b to thereby clamp the product substrate 210 tightly.

The product substrate conveyor frame 214 may be conveyed in at least three directions—two directions in the horizontal plane and vertically as well. The conveyance may be accomplished via a system of motors, rails, and gears (none of which are shown). As such, the product substrate tensioner frame 216 may be conveyed to and held in a specific position as directed and/or programmed and controlled by a user of the apparatus 200.

The wafer tape conveyance mechanism 204 may be implemented to secure a wafer tape 218 having die 220 (i.e., semiconductor device die) thereon. The wafer tape 218 may be conveyed in multiple directions to the specific transfer positions for the transfer operation via a wafer tape conveyor frame 222. Similar to the product substrate conveyor frame 214, the wafer tape conveyor frame 222 may include a system of motors, rails, and gears (none of which are shown).

The unpackaged semiconductor die 220 for transfer may be extremely small. Indeed, the height of the die 220 may range from 12.5 to 200 microns, or from 25 to 100 microns, or from 50 to 80 microns.

Due to the micro size of the die, when the wafer tape 218 has been conveyed to the appropriate transfer position, a gap spacing between the wafer tape 218 and the product substrate 210 may range from about 0.25 mm to 1.50 mm, or about 0.50 mm to 1.25 mm, or about 0.75 mm to 1.00 mm, for example. A minimum gap spacing may depend on factors including: a thickness of the die being transferred, a stiffness of the wafer tape involved, an amount of deflection of the wafer tape needed to provide adequate capture and release of the die, a proximity of the adjacent die, etc. As the distance between the wafer tape 218 and the product substrate 210 decreases, a speed of the transfer operation may also decrease due to the reduced cycle time (discussed further herein) of the transfer operation. Such a decrease in the duration of a transfer operation may therefore increase a rate of die transfer(s). For example, the die transfer rate may range from about 6-20 die placed per second.

Furthermore, the wafer tape conveyor frame 222 may secure a wafer tape holder frame 224, which may stretch and hold the wafer tape 218 under tension. As illustrated in FIG. 2A, the wafer tape 218 may be secured in the wafer tape holder frame 224 via clamping a perimeter of the wafer tape 218 between adjacent components of the wafer holder frame 224. Such clamping assists in maintaining the tension and stretched characteristic of the wafer tape 218, thereby increasing the success rate of the transfer operation. In view of the varying properties of different types/brands/qualities of wafer tapes available, a particular wafer tape may be selected for use based on an ability to consistently remain at a desired tension during a transfer process. In some instances, the needle actuation performance profile (discussed further herein below) may change depending on the tension of the wafer tape 218.

The material used for the wafer tape 218 may include a material having elastic properties, such as a rubber or silicone, for example. Furthermore, inasmuch as temperature of the environment and the wafer tape 218 itself may contribute to potential damage to the wafer tape 218 during the transfer process, a material having properties that are resistant to temperature fluctuation may be advantageous. Additionally, in some instances, the wafer tape 218 may be stretched slightly so as to create a separation or gap between individual die 220 to assist in the transfer operation. A surface of the wafer tape 218 may include a sticky substance via which the die 220 may be removably adhered to the wafer tape 218.

The die 220 on the wafer tape 218 may include die that were individually cut from a solid semiconductor wafer and then placed onto the wafer tape 218 to secure the die. In such a situation, the die may have been pre-sorted and explicitly organized on the wafer tape 218, in order, for example, to assist in the transfer operation. In particular, the die 220 may be arranged sequentially as to the expected order of transfer to the product substrate 210. Such pre-arrangement of the die 220 on the wafer tape 218 may reduce the amount of travel that would otherwise occur between the product substrate conveyance mechanism 202 and the wafer tape conveyance mechanism 204. Additionally, or alternatively, the die on the wafer tape 218 may have been pre-sorted to include only die having substantially equivalent performance properties. In this case, efficiency of the supply chain may be increased and thus, travel time of the wafer tape conveyance mechanism 204 may be reduced to a minimum.

In some instances, materials used for the die may include, but is not limited to, silicon carbide, gallium nitride, a coated silicon oxide, etc. Furthermore, sapphire or silicon may be used as a die as well. Additionally, as indicated above, a "die" may be representative herein of an electrically actuatable element generally.

In some embodiments, the wafer tape 218 may include die that are not pre-sorted, but rather are formed by simply cutting a semiconductor directly on wafer tape, and then leaving the die on the wafer tape without "picking and placing" to sort the die depending on the respective performance quality of the die. In such a situation, the die on the wafer tape may be mapped to describe the exact relative locations of the different quality die. Therefore, in some instances, it may be unnecessary to use wafer tape having pre-sorted die. In such a case, the amount of time and travel for the wafer tape conveyance mechanism 204 to move between particular die for each sequential transfer operation may increase. This may be caused in part by the varying quality of the die dispersed within the area of the semiconductor, which means that die of a specific quality for the next transfer operation may not be immediately adjacent to the previously transferred die. Thus, the wafer tape conveyance mechanism 204 may move the wafer tape 218 further to align an appropriate die of a specific quality for transfer than would be necessary for a wafer tape 218 containing die of substantially equivalent quality.

In further regard to the die 220 on the wafer tape 218, in some instances, a data map of the die 220 may be provided with the wafer tape 218. The data map may include a digital file providing information that describes the specific quality and location of each die on the wafer tape 218. The data map file may be input into a processing system in communication with the apparatus 200, whereby the apparatus 200 may be controlled/programmed to seek the correct die 220 on the wafer tape 218 for transfer to the product substrate 210.

A transfer operation is performed, in part, via the transfer mechanism 206, which is a die separation device for assisting in separation of die from the wafer tape 218. The actuation of the transfer mechanism 206 may cause one or more die 220 to be released from the wafer tape 218 and to be captured by the product substrate 210. In some instances, the transfer mechanism 206 may operate by pressing an elongated rod, such as a pin or a needle 226 into a top surface of the wafer tape 218 against die 220. The needle 226 may be connected to a needle actuator 228. The needle actuator 228 may include a motor connected to the needle 226 to drive the needle 226 toward the wafer tape 218 at predetermined/programmed times.

In view of the function of the needle 226, the needle 226 may include a material that is sufficiently durable to withstand repetitive, rapid, minor impacts while minimizing potential harm to the die 220 upon impact. For example, the needle 226 may include a metal, a ceramic, a plastic, etc. Additionally, a tip of the needle 226 may have a particular shape profile, which may affect the ability of the needle to function repetitively without frequently breaking either the tip or damaging the wafer tape 218 or the die 220. The profile shape of the tip of the needle is discussed in greater detail below with respect to FIG. 3.

In a transfer operation, the needle 226 may be aligned with die 220, as depicted in FIG. 2A, and the needle actuator may move the needle 226 to push against an adjacent side of the wafer tape 218 at a position in which the die 220 is aligned on the opposing side of the wafer tape 218, as depicted in FIG. 2B. The pressure from the needle 226 may cause the wafer tape 218 to deflect so as to extend the die 220 to a position closer to the product substrate 226 than adjacent die 220, which are not being transferred. As indicated above, the amount of deflection may vary depending several factors, such as the thickness of the die and circuit trace. For example, where die 220 is about 50 microns thick and circuit trace 212 is about 10 microns thick, an amount of deflection of the wafer tape 218 may be about 75 microns. Thus, die 220 may be pressed via the needle 226 toward the product substrate 210 to the extent that the electrical contact terminals (not shown) of the die are able to bond with the circuit trace 212, at which point, the transfer operation proceeds to completion and die 220 is/are released from the wafer tape 218.

To the extent that the transfer process may include a rapidly repeated set of steps including a cyclical actuation of the needle 226 pressing upon die 220, a method of the process is described in detail herein below with respect to FIG. 8. Further, the stroke profile of the actuation of the needle 226 (within the context of the transfer process) is discussed in more detail hereafter with respect to FIG. 4.

Turning back to FIGS. 2A and 2B, in some instances, the transfer mechanism 206 may further include a needle retraction support 230, (also known as a pepper pot). In an embodiment, the support 230 may include a structure having a hollowed space wherein the needle 226 may be accommodated by passing into the space via an opening 232 in a first end of the support 230. The support 230 may further include at least one opening 234 on a second opposing end of the support 230. Moreover, the support may include multiple perforations near opening 234. The at least one opening 234 may be sized with respect to a diameter of the needle 226 to accommodate passage of the needle 226 therethrough so as to press on the wafer tape 218 during the transfer process.

Additionally, in some instances, the support 230 may be disposed adjacent to the upper surface of the wafer tape 218. As such, when the needle 226 is retracted from pressing on the wafer tape 218 during a transfer operation, a base surface of the support 230 (having the at least one opening 234 therein) may come into contact with the upper surface of the wafer tape 218, thereby preventing upward deflection of the wafer tape 218. This upward deflection may be caused in the event where the needle 226 pierces at least partially into the wafer tape 218, and while retracting, the wafer tape is stuck to the tip of the needle 226. Thus, the support 230 may reduce the time it takes to move to the next die 220. A wall perimeter shape of the support 230 may be cylindrical or any other shape that may be accommodated in the apparatus 200. Accordingly, the support 230 may be disposed between the needle 226 and an upper surface of the wafer tape 218.

With respect to the effect of temperature on the integrity of the wafer tape 218, it is contemplated that a temperature of support 230 may be adjusted so as to regulate the temperature of the needle 226 and the wafer tape 218, at least near the point of the transfer operation. Accordingly, the temperature of the support 230 may be heated or cooled, and a material of the support 230 may be selected to maximize thermal conductivity. For example, the support 230 may be formed of aluminum, or another relatively high thermal conductivity metal or comparable material, whereby the temperature may be regulated to maintain consistent results of the transfer operations. In some instances, air may be circulated within the support 230 to assist in regulating the temperature of a local portion of the wafer tape 218. Additionally, or alternatively, a fiber optic cable 230a may be inserted into the needle retraction support 230, and may further be against the needle 226 to assist in temperature regulation of the wafer tape 218 and/or the needle 226.

As indicated above, fixing mechanism 208 may assist in affixing the die 220 to the circuit trace 212 on a surface of the product substrate 210. FIG. 2B illustrates the apparatus 200 in a transfer stage, where the die 220 is pushed against the circuit trace 212. In an embodiment, fixing mechanism 208 may include an energy-emitting device 236 including, but not limited to, a laser, electromagnetic radiation, pressure vibration, ultrasonic welding, etc. In some instances, the use of pressure vibration for the energy-emitting device 236 may function by emitting a vibratory energy force so as to cause disruption of the molecules within the circuit trace against those of the electrical contact terminals so as to form a bond via the vibratory pressure.

In a non-limiting example, as depicted in FIG. 2B, a laser may be implemented as the energy-emitting device 236. During a transfer operation, laser 236 may be activated to emit a specific wavelength and intensity of light energy directed at the die 220 being transferred. The wavelength of the light of the laser 236 may be selected specifically based on the absorption of that wavelength of light with respect to the material of the circuit trace 212 without significantly affecting the material of the product substrate 210. For example, a laser having an operational wavelength of 808 nm, and operating at 5 W may be readily absorbed by silver, but not by polyester. As such, the laser beam may pass through the substrate of polyester and affect the silver of a circuit trace. Alternatively, the wavelength of laser may match the absorption of the circuit trace and the material of the substrate. The focus area of the laser 236 (indicated by the dashed lines emanating vertically from the laser 236 in FIG. 2B toward the product substrate 210) may be sized according to the size of the LED, such as for example, a 300 micron wide area.

Upon actuation of a predetermined controlled pulse duration of the laser 236, the circuit trace 212 may begin to cure (and/or melt or soften) to an extent that a fusing bond may form between the material of the circuit trace 212 and the electrical contact terminals (not shown) on the die 220. This bond further assists in separating the unpackaged die 220 from the wafer tape 218, as well as simultaneously affixing the die 220 to the product substrate 210. Additionally, the laser 236 may cause some heat transfer on the wafer tape 218, thereby reducing adhesion of the die 220 to the wafer tape 218 and thus assisting in the transfer operation.

In other instances, die may be released and fixed to the product substrates in many ways, including using a laser having a predetermined wavelength or a focused light (e.g., IR, UV, broadband/multispectral) for heating/activating circuit traces to thereby cure an epoxy or phase change bond materials, or for deactivating/releasing die from wafer tape, or for initiating some combination of reactions. Additionally, or alternatively, a specific wavelength laser or light may be used to pass through one layer of the system and interact with another layer. Furthermore, a vacuum may be implemented to pull die from the wafer tape, and air pressure may be implemented to push the die onto a product substrate, potentially including a rotary head between the die wafer substrate and the product substrate. In yet another instance, ultrasonic vibration may be combined with pressure to cause the die to bond to the circuit traces.

Similar to the needle retraction support 230, the fixing mechanism may also include a product substrate support 238, which may be disposed between the laser 236 and the bottom surface of the product substrate 210. The support 238 may include an opening 240 at a base end thereof and an opening 242 at an upper end thereof. For example, the support 238 may be formed as a ring or hollow cylinder. The support may further include structure to secure a lens (not shown) to assist in directing the laser. The laser 236 emits the light through the openings 240, 242 to reach the product substrate 210. Furthermore, the upper end of the sidewalls of the support 238 may be disposed in direct contact with or closely adjacent to the bottom surface of the product substrate 210. Positioned as such, the support 238 may help to prevent damage from occurring to the product substrate 210 during the stroke of the needle 226 at the time of a transfer operation. In some instances, during the transfer operation, the portion of the bottom surface of the product substrate 210 that is aligned with the support 238 may contact the support 238, which thereby provides resistance against the incoming motion of the die 220 being pressed by the needle 226. Moreover, the support 238 may be movable in a direction of the vertical axis to be able to adjust a height thereof so as to raise and lower support 238 as necessary, including to a height of the product substrate 210.

In addition to the above features, apparatus 200 may further include a first sensor 244, from which apparatus 200 receives information regarding the die 220 on the wafer tape 218. In order to determine which die is/are to be used in the transfer operation, the wafer tape 218 may have a bar code (not shown) or other identifier, which is read or otherwise detected. The identifier may provide die map data to the apparatus 200 via the first sensor 244.

As shown in FIGS. 2A and 2B, the first sensor 244 may be positioned near the transfer mechanism 206 (or the needle 226 specifically), spaced apart from the transfer mechanism 206 by a distance d, which may range from about 1-5 inches, so as to enhance the accuracy of location detection. In an alternative embodiment, first sensor 244 may be disposed adjacent the tip of the needle 226 in order to sense the exact position of the die 220 in real time. During the transfer process, the wafer tape 218 may be punctured and or further stretched over time, which may alter the previously mapped, and thus expected, locations of the die 220 on the wafer tape 218. As such, small changes in the stretching of the wafer tape 218 could add up to significant errors in alignment of the die 220 being transferred. Thus, real time sensing may be implemented to assist in accurate die location.

In some instances, the first sensor 244 may be able to identify the precise location and type of die 220 that is/are being sensed. This information may be used to provide instructions to the wafer tape conveyor frame 222 indicating the exact location to which the wafer tape 218 should be conveyed in order to perform the transfer operation. Sensor 244 may be one of many types of sensors, or a combination of sensor types to better perform multiple functions. Sensor 244 may include, but is not limited to: a laser range finder, or an optical sensor, such as a non-limiting example of a high-definition optical camera having micro photography capabilities.

Moreover, in some instances, a second sensor 246 may also be included in apparatus 200. The second sensor 246 may be disposed with respect to the product substrate 210 so as to detect the precise position of the circuit trace 212 on the product substrate 210. This information may then be used to determine any positional adjustment needed to align the product substrate 210 between the transfer mechanism 206 and the fixing mechanism 208 so that the next transfer operation occurs in the correct location on the circuit trace 212. This information may further be relayed to the apparatus 200 to coordinate conveying the product substrate 210 to a correct position, while simultaneously conveying instructions to the wafer tape conveyor frame 222. A variety of sensors are also contemplated for sensor 246 including optical sensors, such as one non-limiting example of a high-definition optical camera having micro photography capabilities.

FIGS. 2A and 2B further illustrate that the first sensor 244, the second sensor 246, and the laser 236 may be grounded. In some instances, the first sensor 244, the second sensor 246, and the laser 236 may all be grounded to the same ground (G), or alternatively, to a different ground (G).

Depending on the type of sensor used for the first and second sensors 244, 246, the first or second sensors may further be able to test the functionality of transferred die. Alternatively, an additional tester sensor (not shown) may be incorporated into the structure of apparatus 200 to test die before removing the product substrate 210 from the apparatus 200.

Furthermore, in some examples, multiple independently-actuatable needles and/or lasers may be implemented in a machine in order to transfer and affix die at a given time. The multiple needles and/or lasers may be independently movable within a three-dimensional space. Die transfer may be done synchronously (multiple needles going down at the same time), or concurrently but not necessarily synchronously (e.g., one needle going down while the other is going up, which arrangement may balance better the components and minimize vibration). Control of the multiple needles and/or lasers may be coordinated to avoid collisions between the plurality of components. Moreover, in other examples, the multiple needles and/or lasers may be arranged in fixed positions relative to each other.

Example Needle Tip Profile

Figure 3:
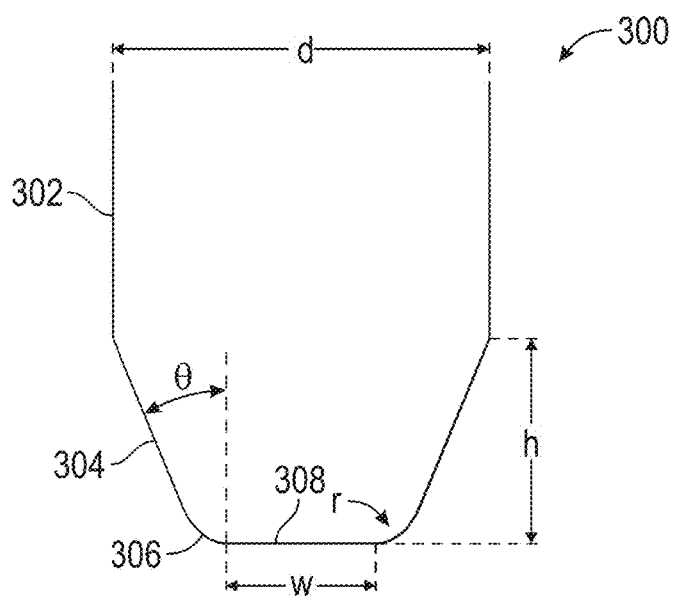
FIG. 3 illustrates an embodiment of a shape profile of the end of a needle of a transfer mechanism.

As mentioned above, a profile shape of the tip 300 of a needle is discussed with respect to FIG. 3, which shows a schematic example profile shape of the tip 300. In an embodiment, the tip 300 may be defined as the end of the needle, including sidewalls 302 adjoining tapered portion 304, corner 306, and base end 308, which may extend transversely to the opposing side of the needle. The specific size and shape of the tip 300 may vary according to factors of the transfer process such as, for example, the size of the die 220 being transferred and the speed and the impact force, of a transfer operation. For example, the angle θ seen in FIG. 3, as measured between a longitudinal direction of the central axis of the needle and the tapered portion 304 may range from about 10 to 15°; the radius r of the corner 306 may range from about 15 to 50+ microns; the width w of the base end 308 may range from about 0 to 100+ microns (μm), where w may be less than or equal to the width of the die 220 being transferred; the height h of the tapered portion 304 may range from about 1 to 2 mm, where h may be greater than a distance traveled by needle during a stroke of a transfer operation; and the diameter d of the needle 226 may be approximately 1 mm.

Other needle tip profiles are contemplated and may have different advantages depending on various factors associated with the transfer operation. For example, the needle tip 300 may be more blunt to mirror the width of the die or more pointed so as to press in a smaller area of the wafer tape.

Example Needle Actuation Performance Profile

Figure 4:
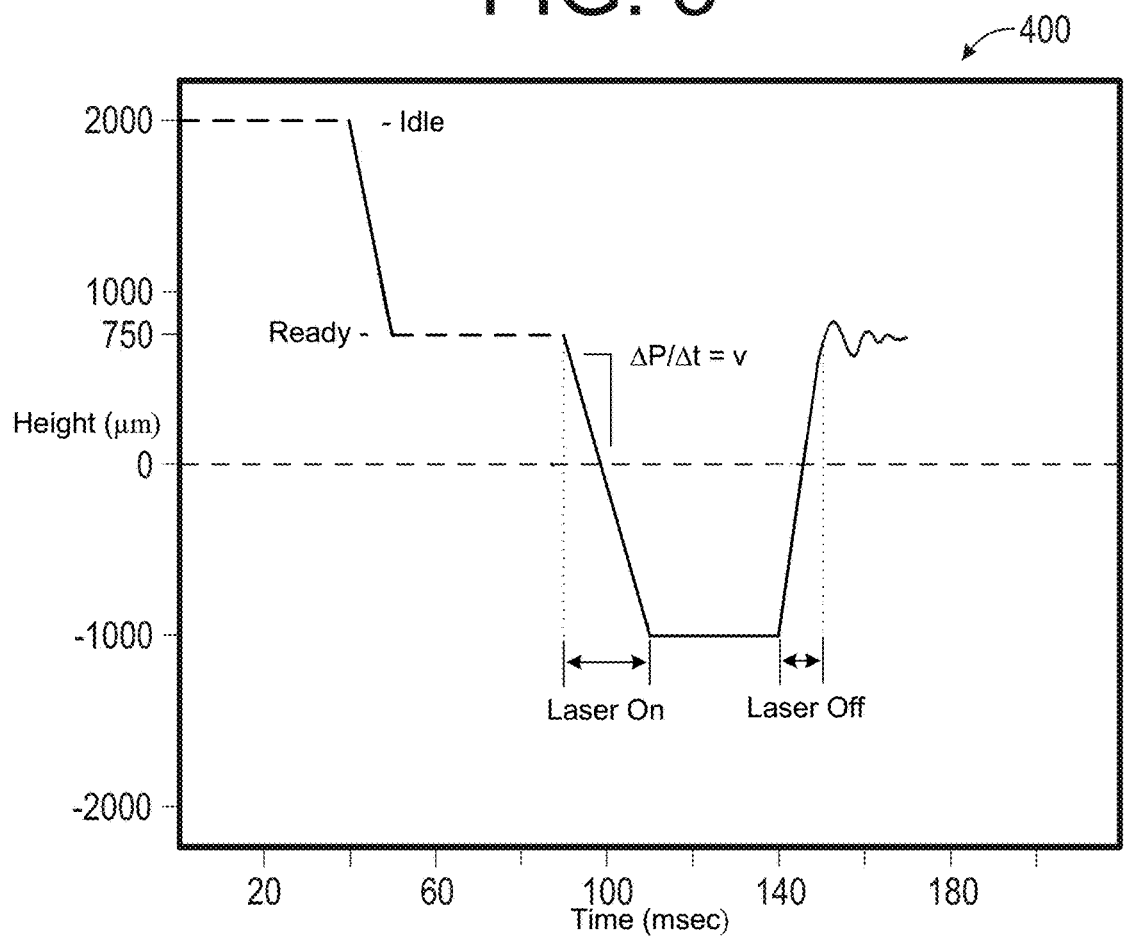
FIG. 4 illustrates an embodiment of a needle actuation stroke profile.

Illustrated in FIG. 4 is an embodiment of a needle actuation performance profile. That is, FIG. 4 depicts an example of the stroke pattern performed during a transfer operation by displaying the height of the needle tip with respect to the plane of the wafer tape 218 as it varies with time. As such, the "0" position in FIG. 4 may be the upper surface of the wafer tape 218. Further, inasmuch as the idle time of the needle and the ready time of the needle may vary depending on the programmed process or the varying duration of time between transferring a first die and the time it takes to reach a second die for transfer, the dashed lines shown at the idle and ready phases of the stroke pattern indicate that the time is approximate, but may be longer or shorter in duration. Moreover, it is to be understood that the solid lines shown for use of the laser are example times for an embodiment illustrated herewith, however, the actual duration of laser on and off time may vary depending on the materials used in forming the circuit (such as the material choice of the circuit trace), the type of product substrate, the desired effect (pre-melting circuit trace, partial bond, complete bond, etc.), the distance of the laser from the bond point (i.e., the upper surface of the product substrate), the size of the die being transferred, and the power/intensity/wavelength of the laser, etc. Accordingly, the following description of the profile shown in FIG. 4 may be an example embodiment of a needle profile.

In some instances, prior to a transfer operation, a fully retracted needle tip may be idle at approximately 2000 μm above the surface of the wafer tape. After a varying amount of time, the needle tip may descend rapidly to rest in the ready state at approximately 750 μm above the surface of the wafer tape. After another undetermined amount of time at the ready state, the needle tip may descend again to contact the die and press the wafer tape with the die down to a height of approximately −1000 μm, where at the die may be transferred to the product substrate. The dotted vertical line at the start of the laser on section indicates that the laser may come on at some point between the beginning of the descent from the ready phase and the bottom of the stroke of the needle tip. For example, the laser may turn on at approximately 50% of the way through the descent. In some instances, by turning the laser on early, for example before the needle begins to descend, the circuit trace may begin to soften prior to contact with the die so as to form a stronger bond, or additionally, the die wafer may be affected or prepared during this time. The phase in which the laser turns on may last approximately 20 ms ("milliseconds"). At the bottom of the stroke, where the laser is on, that phase may be a bonding phase between the die and the product substrate. This bonding phase may allow the circuit trace to attach to the die contacts, which stiffens quickly after the laser is turned off. As such, the die may be bonded to the product substrate. The bonding phase may last approximately 30 ms. Thereafter, the laser may be turned off and the needle may ascend to the ready phase rapidly. Conversely, the laser may be turned off before the needle begins to ascend, or at some point during the ascent of the needle tip back to the ready phase, the laser may be turned off. After the ascent of the needle tip to the ready phase, the height of the needle tip may overshoot and bounce back under the height of the ready phase somewhat buoyantly. While some of the buoyancy may be attributed to the speed at which the needle tip ascends to the ready phase, the speed and the buoyancy may be intentional in order to assist in retracting a tip of the needle from a surface of the wafer tape in the case where the needle has pierced the wafer tape and may be stuck therein.

As depicted in FIG. 4, the timing in which the laser is turned off may be longer than the timing in which the laser is turned on, where a slower speed of the descent may assist in preventing damage to the die, and as mentioned above, the rapid rate of ascent may assist in extracting the needle tip from the wafer tape more effectively. Nevertheless, as previously stated, the timing shown on FIG. 4 is approximate, particularly with respect to the idle and ready periods. Therefore, the numerical values assigned along the bottom edge of the FIG. 4 are for reference and should not be taken literally, except when otherwise stated.

Example Product Substrate

Figure 5:
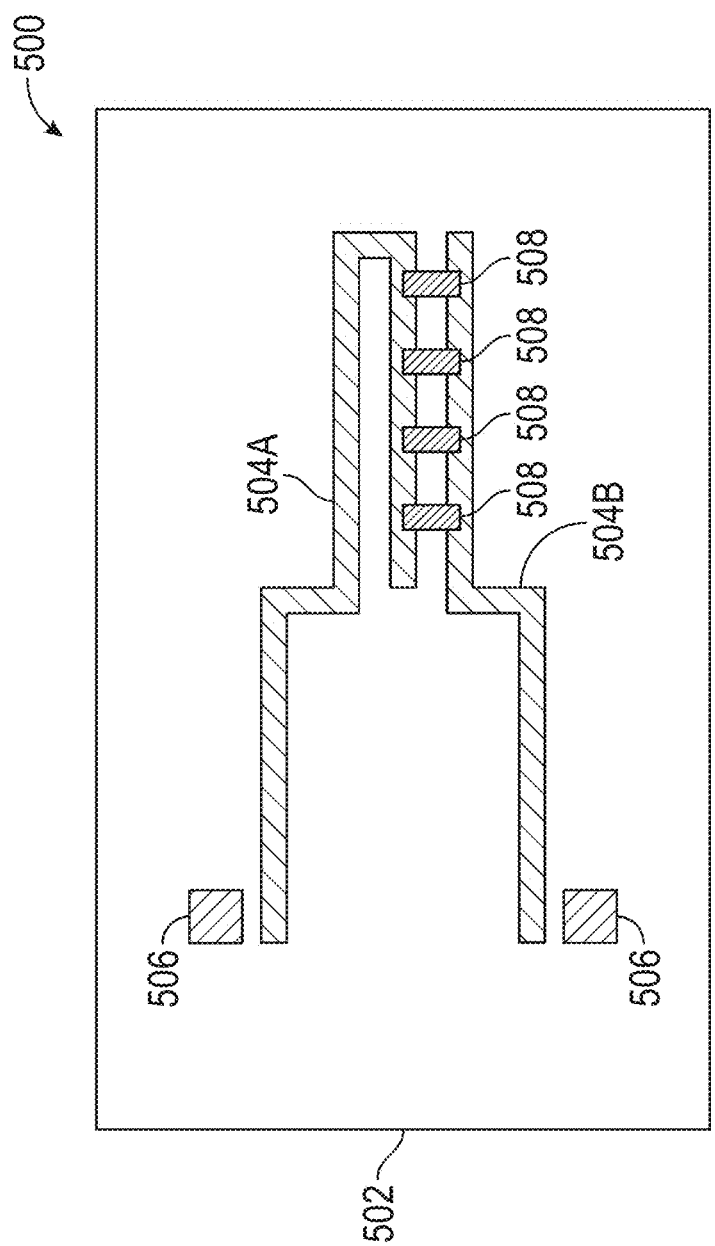
FIG. 5 illustrates a plan view of an embodiment of a product substrate having a circuit trace thereon.

FIG. 5 illustrates an example embodiment of a processed product substrate 500. A product substrate 502 may include a first portion of a circuit trace 504A, which may perform as a negative or positive power terminal when power is applied thereto. A second portion of the circuit trace 504B may extend adjacent to the first portion of the circuit trace 504A, and may act as a corresponding positive or negative power terminal when power is applied thereto.

As similarly described above with respect to the wafer tape, in order to determine where to convey the product substrate 502 to perform the transfer operation, the product substrate 502 may have a bar code (not shown) or other identifier, which is read or otherwise detected. The identifier may provide circuit trace data to the apparatus. The product substrate 502 may further include datum points 506. Datum points 506 may be visual indicators for sensing by the product substrate sensor (for example, second sensor 246 in FIG. 2) to locate the first and second portions of the circuit trace 504A, 504B. Once the datum points 506 are sensed, a shape and relative position of the first and second portions of the circuit trace 504A, 504B with respect to the datum points 506 may be determined based on preprogrammed information. Using the sensed information in connection with the preprogrammed information, the product substrate conveyance mechanism may convey the product substrate 502 to the proper alignment position for the transfer operation.

Additionally, die 508 are depicted in FIG. 5 as straddling between the first and second portions of the circuit trace 504A, 504B. In this manner, the electrical contact terminals (not shown) of the die 508 may be bonded to the product substrate 502 during a transfer operation. Accordingly, power may be applied to run between the first and second portions of the circuit trace 504A, 504B, and thereby powering die 508. For example, the die may be unpackaged LEDs that were directly transferred from a wafer tape to the circuit trace on the product substrate 502. Thereafter, the product substrate 502 may be processed for completion of the product substrate 502 and used in a circuit or other final product. Further, other components of a circuit may be added by the same or other means of transfer to create a complete circuit, and may include control logic to control LEDs as one or more groups in some static or programmable or adaptable fashion.

Simplified Example Direct Transfer System

Figure 6:
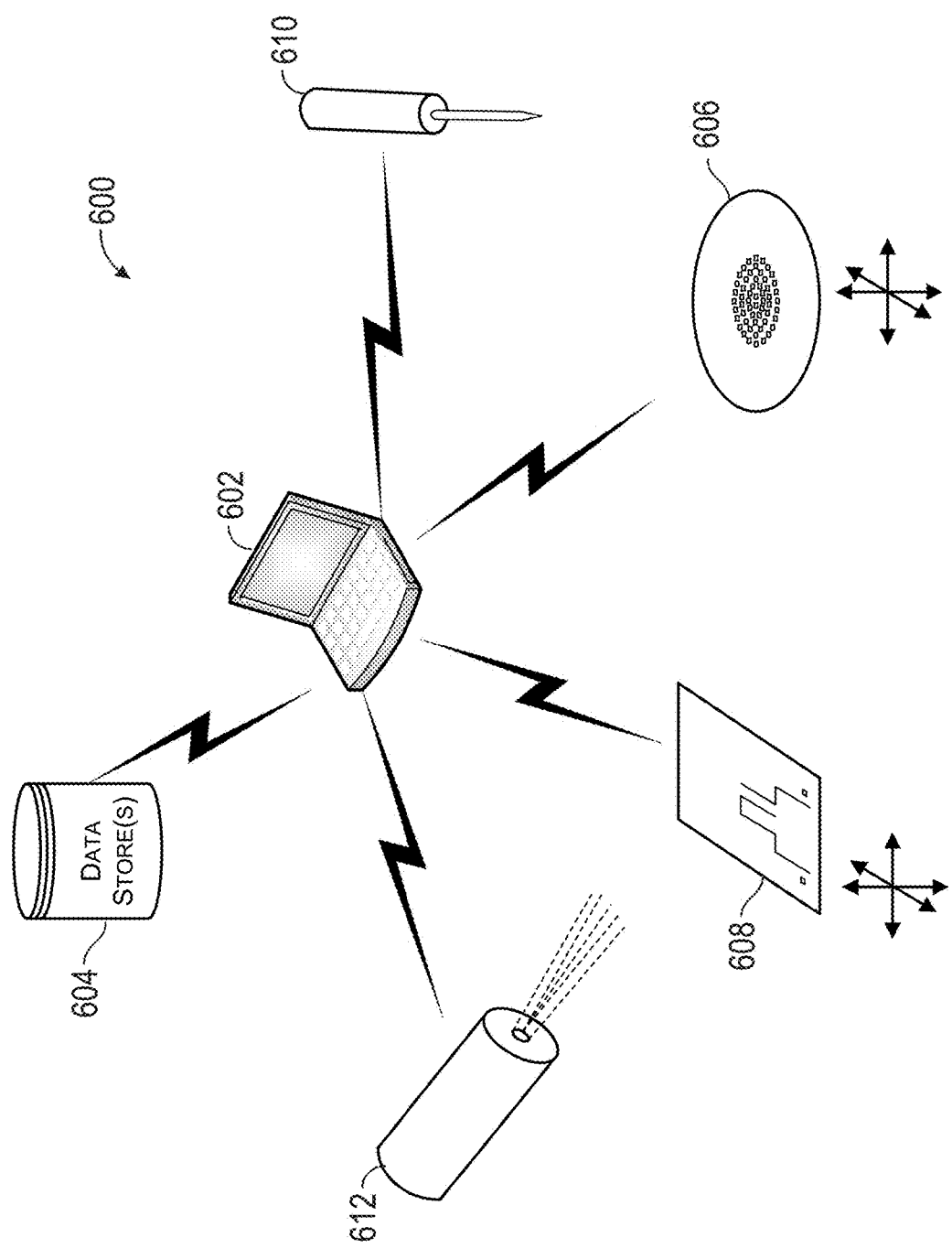
FIG. 6 illustrates a schematic view of an embodiment of elements of a die transfer system.

A simplified example of an embodiment of a direct transfer system 600 is illustrated in FIG. 6. The transfer system 600 may include a personal computer (PC) 602 (or server, data input device, user interface, etc.), a data store 604, a wafer tape mechanism 606, a product substrate mechanism 608, a transfer mechanism 610, and a fixing mechanism 612. Inasmuch as a more detailed description of the wafer tape mechanism 606, the product substrate mechanism 608, the transfer mechanism 610, and the fixing mechanism 612 has been given heretofore, specific details about these mechanisms is not repeated here. However, a brief description of how the wafer tape mechanism 606, the product substrate mechanism 608, the transfer mechanism 610, and the fixing mechanism 612 relate to interactions between the PC 602 and the data store 604 is described hereafter.

In some instances, the PC 602 communicates with data store 604 to receive information and data useful in the transfer process of directly transferring die from a wafer tape in wafer tape mechanism 606 using the transfer mechanism 610 on to a product substrate in the product substrate mechanism 608 whereat the die may be fixed upon the product substrate via actuation of a laser or other energy-emitting device located in the fixing mechanism 612. PC 602 may also serve as a receiver, compiler, organizer, and controller of data being relayed to and from each of the wafer tape mechanism 606, the product substrate mechanism 608, the transfer mechanism 610, and the fixing mechanism 612. PC 602 may further receive directed information from a user of the transfer system 600.

Note that, while FIG. 6 depicts directional movement capability arrows adjacent to the wafer tape mechanism 606 and the product substrate mechanism 608, those arrows merely indicate general directions for mobility, however, it is contemplated that both the wafer tape mechanism 606 and the product substrate mechanism 608 may also be able to move in other directions including rotation in plane, pitch, roll, and yaw, for example.

Figure 7:
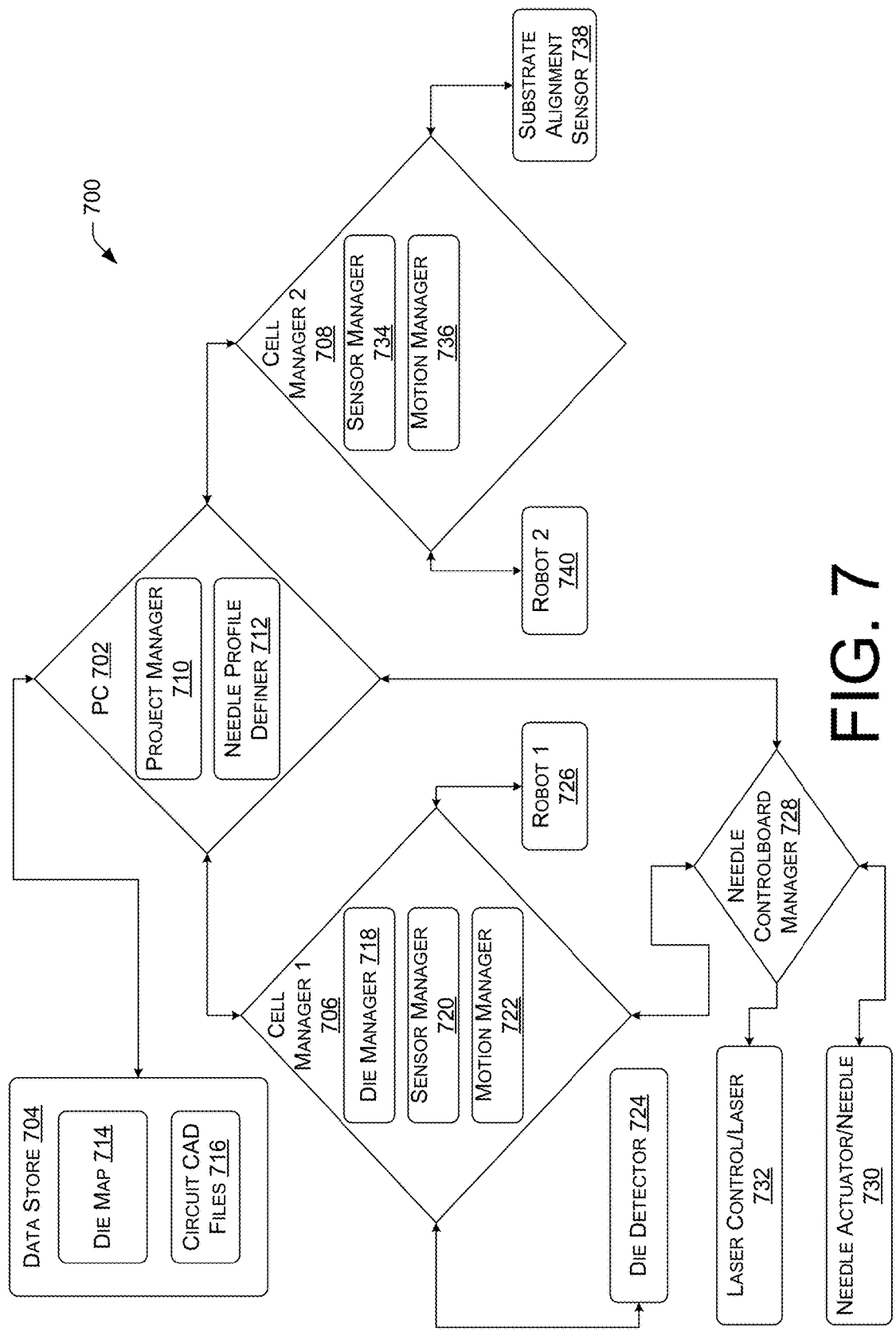
FIG. 7 illustrates a schematic view of an embodiment of a circuitry path between machine hardware and controllers of a die transfer system.

Additional details of the interaction of the components of the transfer system 600 are described with respect to FIG. 7 below.

Detailed Example Direct Transfer System

A schematic of the communication pathways between the respective elements of a transfer system 700 may be described as follows.

The direct transfer system may include a personal computer (PC) 702 (or server, data input device, user interface, etc.), which may receive communication from, and provide communication to a data store 704. The PC 702 may further communicate with a first cell manager 706 (illustrated as "Cell Manager 1") and a second cell manager 708 (illustrated as "Cell Manager 2"). Therefore, the PC 702 may control and synchronize the instructions between the first cell manager 706 and the second cell manager 708.

PC 702 may include processors and memory components with which instructions may be executed to perform various functions with respect to the first and second cell managers 706, 708, as well as data store 704. In some instances, PC 702 may include a project manager 710 and a needle profile definer 712.

Project manager 710 may receive input from the first and second cell managers 706, 708 and data store 704 to organize the direct transfer process and maintain smooth functioning with respect to orientation and alignment of the product substrate with respect to the wafer tape and the die thereon.

Needle profile definer 712 may contain data regarding the needle stroke performance profile, which may be used to instruct the transfer mechanism regarding the desired needle stroke performance according to the specific die on the loaded wafer tape and the pattern of the circuit trace on the product substrate. Additional details of the needle profile definer 712 are discussed further herein below.

Turning back to data store 704, data store 704 may include memory containing data such as a die map 714, which may be specific to the wafer tape loaded in the wafer tape mechanism. As explained previously, a die map may describe the relative locations of each die on the wafer tape and the quality thereof for the purpose of providing a pre-organized description of the location of specific die. Further, data store 704 may also include memory containing circuit CAD files 716. Circuit CAD files 716 may contain data regarding a specific circuit trace pattern on the loaded product substrate.

Project manager 710 may receive the die map 714 and circuit CAD files 716 from the data store 704, and may relay the respective information to the first and second cell managers 706, 708, respectively.

In an embodiment, the first cell manager 706 may use the die map 714 from data store 704 via a die manager 718. More specifically, die manager 718 may compare die map 714 with the information received by a sensor manager 720, and based thereon, may provide instructions to a motion manager 722 regarding the location of a particular die. Sensor manager 720 may receive data regarding the actual location of die on the wafer tape from a die detector 724. Sensor manager 720 may also instruct the die detector 724 to look for a particular die in a particular location according to die map 714. The die detector 724 may include a sensor such as the second sensor 244 in FIGS. 2A and 2B. Based on the received data of the actual location (either a confirmation or an update regarding a shift in position) of the die on the wafer tape, the motion manager 722 may instruct a first robot 726 (illustrated as "Robot 1") to convey the wafer tape to an alignment position with the needle of the transfer mechanism.

Upon reaching the instructed location, the first robot 726 may communicate the completion of its movement to a needle controlboard manager 728. Additionally, the needle control board manager 728 may directly communicate with the PC 702 to coordinate the execution of the transfer operation. At the time of the execution of the transfer operation, the PC 702 may instruct the needle control board manager 728 to activate the needle actuator/needle 730, thereby causing the needle to perform a stroke in accordance with the loaded needle profile in the needle profile definer 712. The needle controlboard manager 728 may also activate the laser control/laser 732, thereby causing the laser to emit a beam toward the product substrate as the needle presses down a die via the wafer tape to execute the transfer operation. As indicated above, the activation of the laser control/laser 732 may occur prior to, simultaneously, during, or after activation, or even a complete actuation, of the needle stroke.

Accordingly, the first cell manager 706 may pass through a plurality of states including: determining where to tell the first robot 726 to go; telling the first robot 726 to go to the determined location; turning on the needle; activating the fixing device; and resetting.

Prior to execution of the transfer operation, the project manager 710 may relay the data of the circuit CAD files 716 to the second cell manager 708. The second cell manager 708 may include a sensor manager 734 and a motion manager 736. Using the circuit CAD files 716, the sensor manager 734 may instruct the substrate alignment sensor 738 to find the datum points on the product substrate and thereby detect and orient the product substrate according to the location of the circuit trace thereon. The sensor manager 734 may receive confirmation or updated location information of the circuit trace pattern on the product substrate. The sensor manager 734 may coordinate with the motion manager 736 to provide instructions to a second robot 740 (illustrated as "Robot 2") to convey the product substrate to an alignment position (i.e., a transfer fixing position) for execution of the transfer operation. Thus, the circuit CAD files 716 may assist the project manager 710 in aligning the product substrate with respect to the wafer tape such that the die may be accurately transferred to the circuit trace thereon.

Accordingly, the second cell manager 708 may pass through a plurality of states including: determining where to tell the second robot 740 to go; telling the second robot 740 to go to the determined location; and resetting.

It is understood that additional and alternative communication pathways between all or fewer than all of the various components of the direct transfer system 700 described above are possible.

Example Direct Transfer Method

Figure 8:
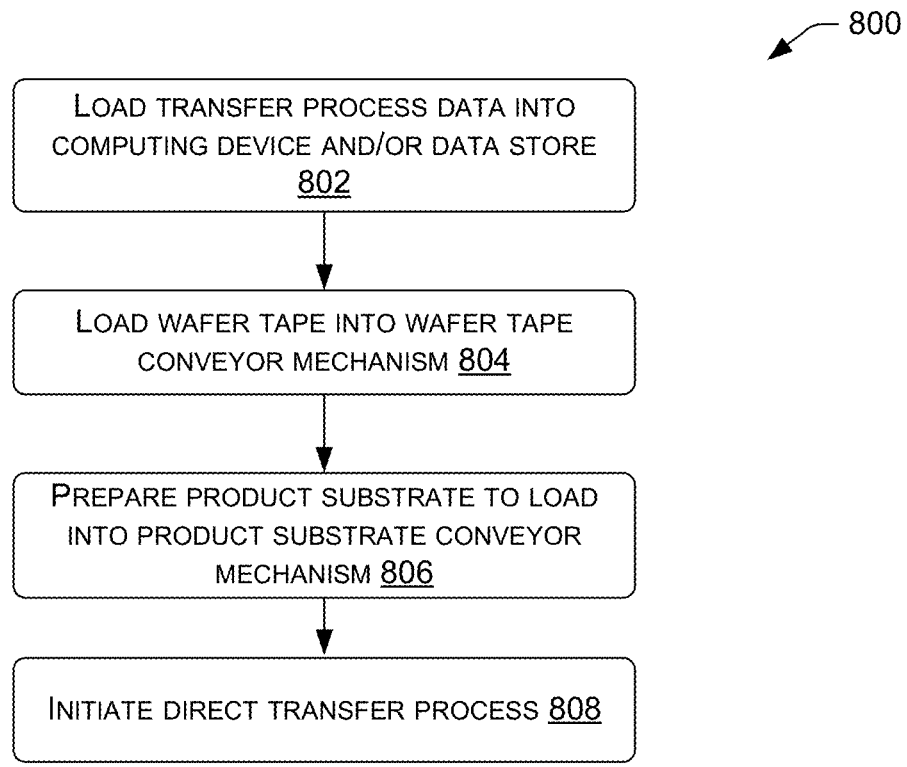
FIG. 8 illustrates a method of a die transfer process according to an embodiment of this application.

A method 800 of executing a direct transfer process, in which die is/are directly transferred from a wafer tape to a product substrate, is illustrated in FIG. 8. The steps of the method 800 described herein may not be in any particular order and as such may be executed in any satisfactory order to achieve a desired product state. The method 800 may include a step of loading transfer process data into a PC and/or a data store 802. The transfer process data may include data such as die map data, circuit CAD files data, and needle profile data.

A step of loading a wafer tape into a wafer tape conveyor mechanism 804 may also be included in method 800. Loading the wafer tape into the wafer tape conveyor mechanism may include controlling the wafer tape conveyor mechanism to move to a load position, which is also known as an extract position. The wafer tape may be secured in the wafer tape conveyor mechanism in the load position. The wafer tape may be loaded so that the die of the semiconductor are facing downward toward the product substrate conveyor mechanism.

The method 800 may further include a step of preparing the product substrate to load into the product substrate conveyor mechanism 806. Preparing the product substrate may include a step of screen printing a circuit trace on the product substrate according to the pattern of the CAD files being loaded into the PC or data store. Additionally, datum points may be printed onto the circuit substrate in order to assist in the transfer process. The product substrate conveyor mechanism may be controlled to move to a load position, which is also known as an extraction position, whereat the product substrate may be loaded into the product substrate conveyor mechanism. The product substrate may be loaded so that the circuit trace faces toward the die on the wafer. In some instances, for example, the product substrate may be delivered and placed in the load position by a conveyor (not shown) or other automated mechanism, such as in the style of an assembly line. Alternatively, the product substrate may be manually loaded by an operator.

Once the product substrate is properly loaded into the product substrate conveyor mechanism in the wafer tape is properly loaded into the wafer tape conveyor mechanism, a program to control the direct transfer of the die from the wafer tape to the circuit trace of the product substrate may be executed via the PC to commence the direct transfer operation 808. The details of the direct transfer operation are described below.

Example Direct Transfer Operation Method

Figure 9:
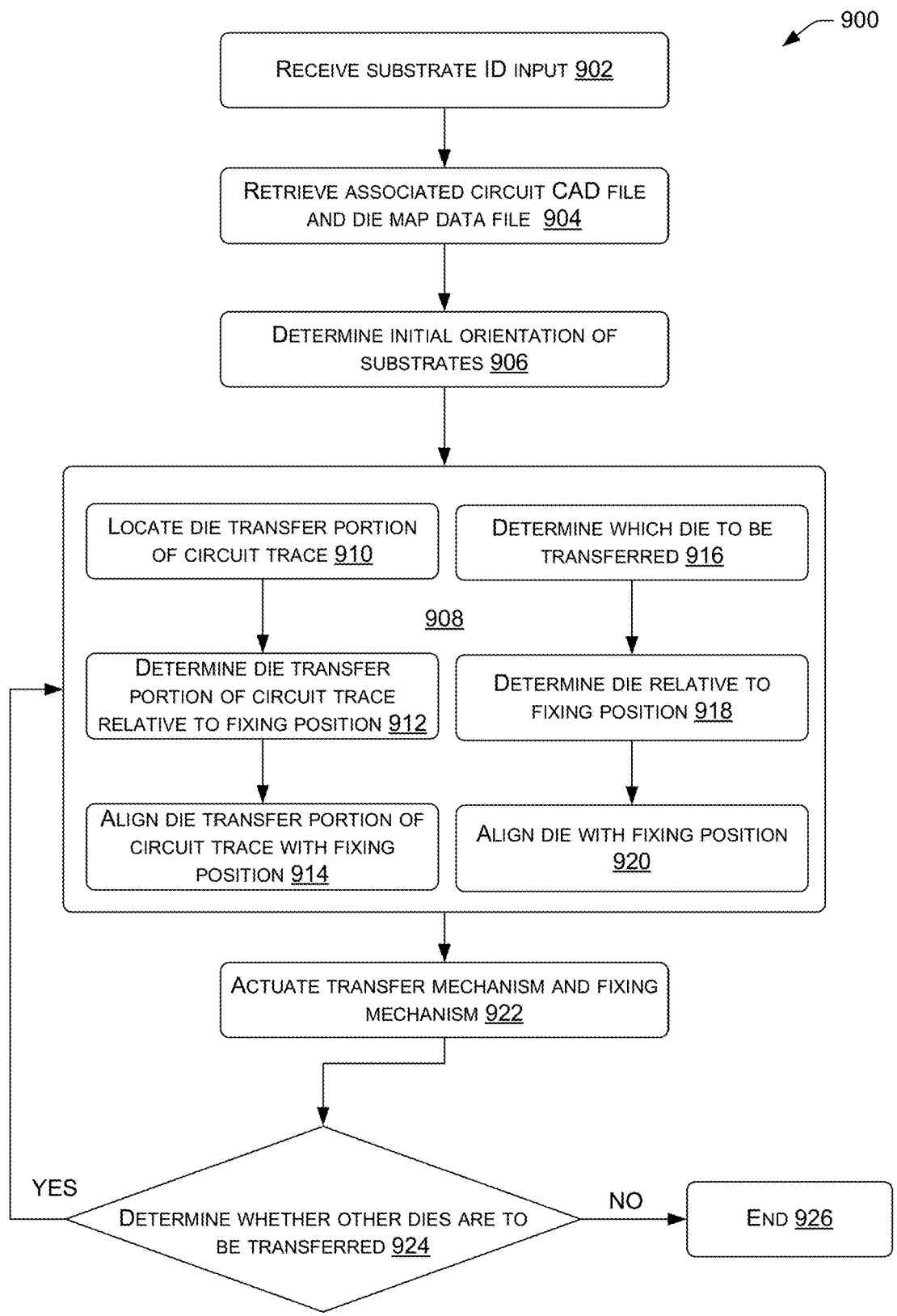
FIG. 9 illustrates a method of a die transfer operation according to an embodiment of this application.

A method 900 of the direct transfer operation of causing die to be transferred directly from the wafer tape (or other substrate holding die, also called a "die substrate" for simplified description of FIG. 9) to the product substrate is illustrated in FIG. 9. The steps of the method 900 described herein may not be in any particular order and as such may be executed in any satisfactory order to achieve a desired product state.

In order to determine which die to place on the product substrate and where to place the die on the product substrate, the PC may receive input regarding the identification of the product substrate and the identification of the die substrate containing the die to be transferred 902. This input may be entered manually by a user, or the PC may send a request to the cell managers in control, respectively, of the product substrate alignment sensor and the die detector. The request may instruct the sensor to scan the loaded substrate for an identification marker, such as a barcode or QR code; and/or the request may instruct the detector to scan the loaded die substrate for an identification marker, such as a barcode or QR code.

Using the product substrate identification input, the PC may query the data store or other memory to match the respective identification markers of the product substrate and the die substrate and retrieve the associated data files 904. In particular, the PC may retrieve a circuit CAD file associated with the product substrate that describes the pattern of the circuit trace on the product substrate. The circuit CAD file may further contain data such as the number of, relative positions of, and respective quality requirement of, the die to be transferred to the circuit trace. Likewise, the PC may retrieve a die map data file associated with the die substrate that provides a map of the relative locations of the specific die on the die substrate.

In the process of executing a transfer of a die to the product substrate, the PC may determine the initial orientation of the product substrate and the die substrate relative to the transfer mechanism and the fixing mechanism 906. Within step 906, the PC may instruct the substrate alignment sensor to locate datum points on the product substrate. As discussed above, the datum points may be used as reference markers for determining the relative location and orientation of the circuit trace on the product substrate. Further, the PC may instruct the die detector to locate one or more reference points on the die substrate to determine the outlay of the die.

Once the initial orientation of the product substrate and die substrate are determined, the PC may instruct the respective product substrate and die substrate conveyance mechanisms to orient the product substrate and die substrate, respectively, into a position of alignment with the transfer mechanism and the fixing mechanism 908.

The alignment step 908 may include determining the location of the portion of the circuit trace to which die is/are to be transferred 910, and where the portion is located relative to the transfer fixing position 912. The transfer fixing position may be considered to be the point of alignment between the transfer mechanism and the fixing mechanism. Based on the data determined in steps 910 and 912, the PC may instruct the product substrate conveyance mechanism to convey the product substrate so as to align the portion of the circuit trace to which die is/are to be transferred with the transfer fixing position 914.

The alignment step 908 may further include determining which die on the die substrate will be transferred 916, and where the die is located relative to the transfer fixing position 918. Based on the data determined in steps 916 and 918, the PC may instruct the wafer tape conveyance mechanism to convey the die substrate so as to align the die to be transferred with the transfer fixing position 920.

Once the die to be transferred from the die substrate and the portion of the circuit trace to which die is/are to be transferred are aligned with the transfer mechanism and the fixing mechanism, the needle and the fixing device (e.g., laser) may be actuated 922 to effectuate the transfer of the die from the die substrate to the product substrate.

After die is/are transferred, the PC may determine whether additional die are to be transferred 924. In the case where another die is to be transferred, the PC may revert to step 908 and realign the product and die substrates accordingly for a subsequent transfer operation. In the case where there will not be another die transferred, the transfer process is ended 926.

Example Direct Transfer Conveyor/Assembly Line System

Figure 10:
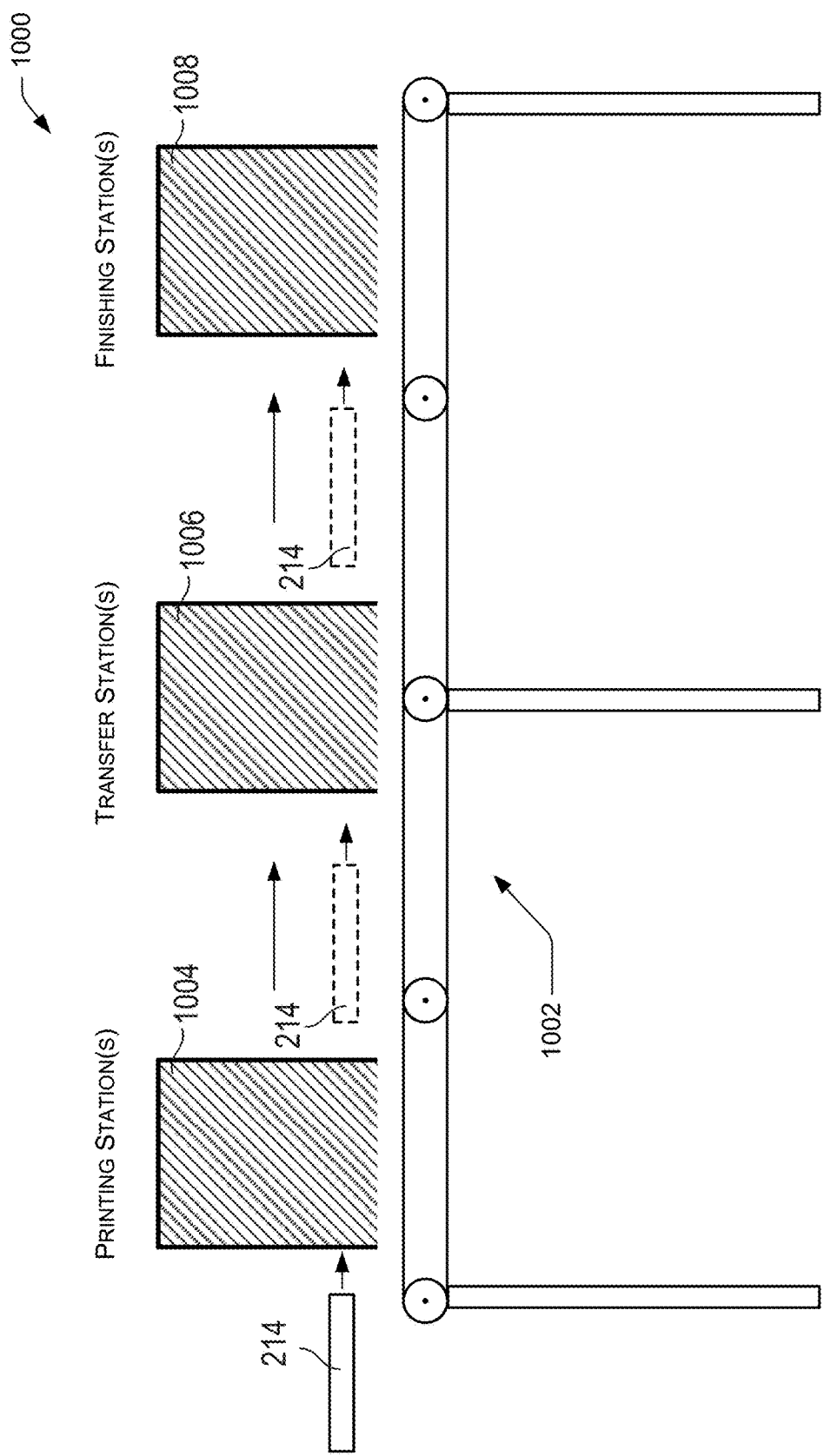
FIG. 10 illustrates an embodiment of a direct transfer apparatus and process implementing a conveyor system.

In an embodiment described with respect to FIG. 10, several of the components of the direct transfer apparatus described above may be implemented in a conveyor/assembly line system 1000 (hereinafter "conveyor system"). In particular, FIGS. 2A and 2B depict the product substrate 210 being held by the product substrate conveyor frame 214 and tensioned by the product substrate tensioner frame 216. As an alternative to securing a product substrate conveyor frame 214 in a confined area via a system of motors, rails, and gear as indicated with respect to apparatus 200, FIG. 10 illustrates the product substrate conveyor frame 214 being conveyed through the conveyor system 1000 in which the product substrate goes through an assembly line style process. As the actual means of conveyance between operations being performed on the product substrate being conveyed, the conveyor system 1000 may include a series of tracks, rollers, and belts 1002 and/or other handling devices to sequentially convey a plurality of product substrate conveyor frames 214, each holding a product substrate.

In some instances, operation stations of the conveyor system 1000 may include one or more printing stations 1004. As blank product substrates are conveyed to the printing station(s) 1004, a circuit trace may be printed thereon. In the case that there are multiple printing stations 1004, the multiple printing stations 1004 may be arranged serially, and may be configured to perform one or more printing operations each so as to form a complete circuit trace.

Additionally, in the conveyor system 1000, the product substrate conveyor frame 214 may be conveyed to one or more die transfer stations 1006. In the event that there are multiple die transfer stations 1006, the multiple die transfer stations 1006 may be arranged serially, and may be configured to perform one or more die transfers each. At the transfer station(s), the product substrates may have die transferred and affixed thereto via a transfer operation using one or more of the direct transfer apparatus embodiments described herein. For example, each transfer station 1006 may include a wafer tape conveyance mechanism, a transfer mechanism, and a fixing mechanism. In some instances, a circuit trace may have been previously prepared on the product substrate, and as such, the product substrate may be conveyed directly to the one or more transfer stations 1006.

In the transfer stations 1006, the wafer tape conveyance mechanism, the transfer mechanism, and the fixing mechanism may be aligned with respect to the conveyed product substrate conveyor frame 214 upon entering the station. In this situation, the transfer station 1006 components may repeatedly perform the same transfer operation in the same relative position on each product substrate as the plurality of product substrates are conveyed through the conveyor system 1000.

Moreover, the conveyor system 1000 may further include one or more finishing stations 1008 to which the product substrate may be conveyed to have final processing performed. The type, amount, and duration of the final processing may depend on the features of the product and the properties of the materials used to make the product. For example, the product substrate may receive additional curing time, a protective coating, additional components, etc., at the finishing station(s) 1008.

Second Example Embodiment of a Direct Transfer Apparatus

Figure 11:
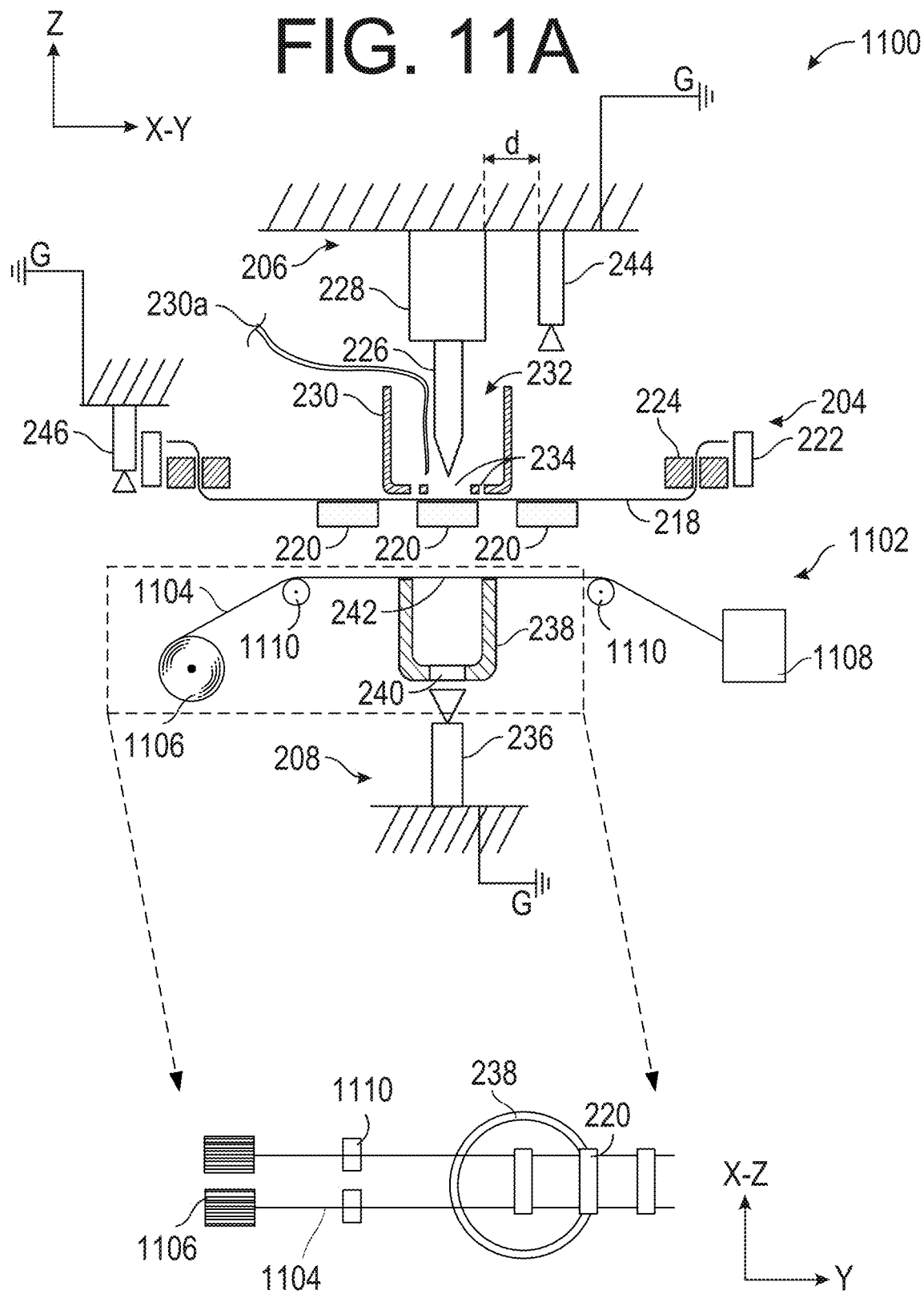
FIG. 11A illustrates a schematic view of another embodiment of a transfer apparatus in a pre-transfer position.
FIG. 11B illustrates a schematic top view of the product substrate conveyance mechanism post-transfer operation of the embodiment in FIG. 11A.

In another embodiment of a direct transfer apparatus, as seen in FIGS. 11A and 11B, a "light string" may be formed. While many of the features of apparatus 1100 may remain substantially similar to those of apparatus 200 of FIGS. 2A and 2B, product substrate conveyance mechanism 1102, as depicted in FIGS. 11A and 11B, may be configured to convey a product substrate 1104 that is different than the product substrate 212. Specifically, in FIGS. 2A and 2B, the product substrate conveyance mechanism 202 includes the conveyor frame 214 and the tensioner frame 216, which secure the sheet-like product substrate 212 under tension. In the embodiment of FIGS. 11A and 11B, however, the product substrate conveyance mechanism 1102 may include a product substrate reel system.

The product substrate reel system may include one or two circuit trace reels 1106 that are wound with a "string circuit," which may include a pair of adjacently wound conductive strings or wires as the product substrate 1104. In an instance with only one reel, the reel 1106 may be located on a first side of the transfer position, and the pair of conductive strings (1104) may be wound around the single reel 1106. Alternatively, there may be two circuit trace reels 1106 located on the first side of the transfer position, where each reel 1106 contains a single strand of the string circuit and the strands are then brought together to pass through the transfer position.

Regardless of whether one reel 1106 or two reels 1106 are implemented, the die transfer process of forming the string circuit may be substantially similar in each case. In particular, the conductive strings of the product substrate 1104 may be threaded from the reel(s) 1106 across the transfer position and may be fed into a finishing device 1108. In some instances, the finishing device 1108 may be: a coating device to receive a protective coating, for example, of a translucent or transparent plastic; or a curing apparatus, which may finish curing the string circuit as a part of final processing of the product. Additionally, or alternatively, the circuit string may be fed onto another reel, which may wind up the string circuit thereon before final processing of the string circuit. As the conductive strings of the product substrate 1104 are pulled through the transfer position, the transfer mechanism 206 may be actuated to perform a needle stroke (as described above) to transfer die 220 to the conductive strings of the product substrate 1104 so that electrical contact terminals of the die 220 are placed, respectively, on the adjacent strings, and the fixing mechanism 208 may be actuated to affix the die 220 in position.

Furthermore, apparatus 1100 may include tensioning rollers 1110 on which the conductive strings of the product substrate 1104 may be supported and further tensioned against. Thus, the tensioning rollers 1110 may assist in maintaining tension in the formed string circuit so as to enhance the die transfer accuracy.

In FIG. 11B, die 220 are depicted as having been transferred to the conductive strings of the product substrate 1104, thereby uniting (to some extent) the conductive strings of the product substrate 1104 and forming a string circuit.

Third Example Embodiment of a Direct Transfer Apparatus

Figure 12:
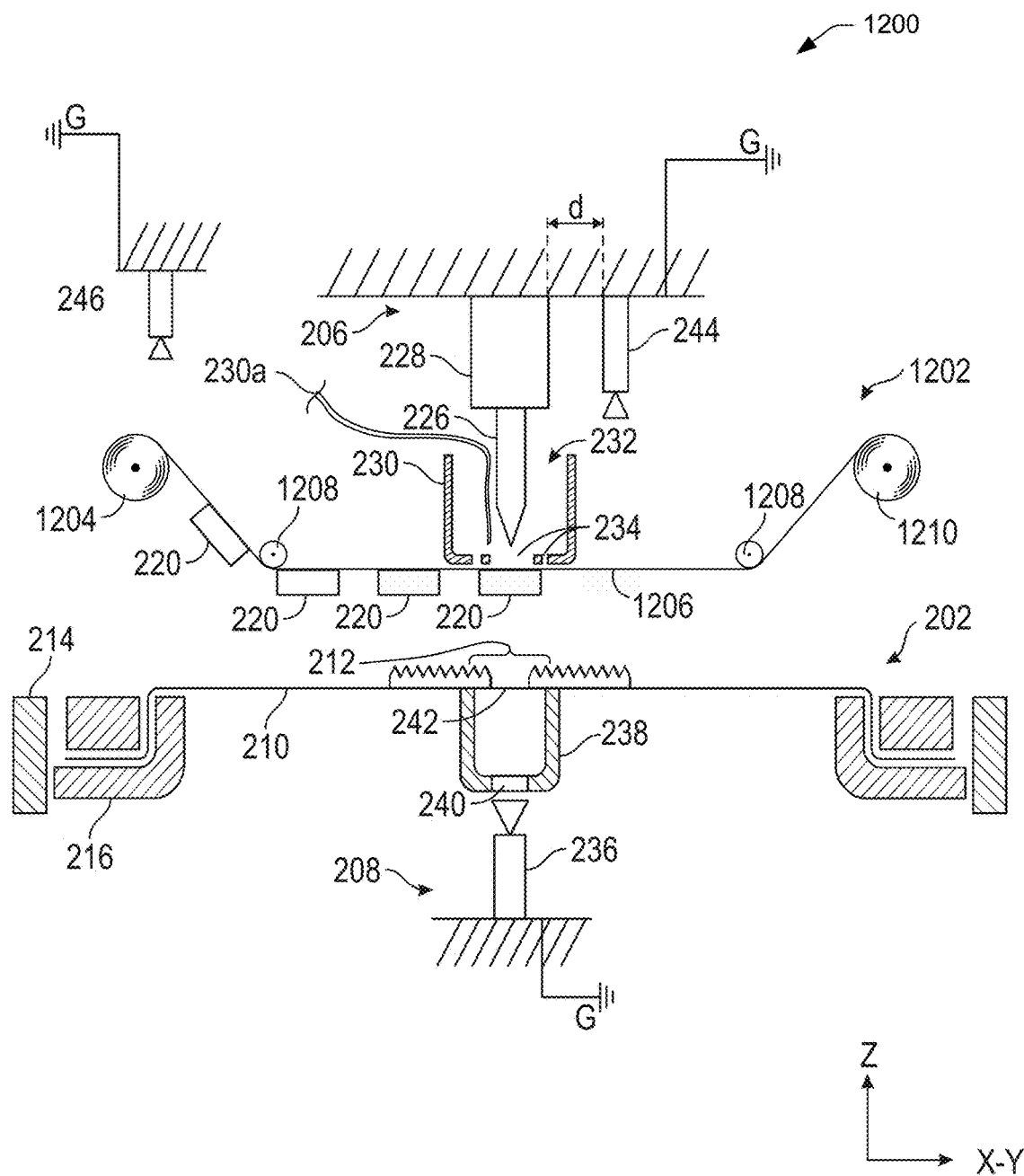
FIG. 12 illustrates a schematic view of another embodiment of a transfer apparatus in a pre-transfer position.

In an additional embodiment of a direct transfer apparatus, as seen in FIG. 12, apparatus 1200 may include a wafer tape conveyance mechanism 1202. In particular, in lieu of the wafer tape conveyor frame 222 and the tensioner frame 224 shown in FIGS. 2A and 2B, the wafer tape conveyance mechanism 1202 may include a system of one or more reels 1204 to convey die 220 through the transfer position of the apparatus 1200 to transfer die to a single substrate. In particular, each reel 1204 may include a substrate 1206 formed as a narrow, continuous, elongated strip having die 220 attached consecutively along the length of the strip.

In the case where a single reel 1204 is used, a transfer operation may include conveying the product substrate 210 via the product substrate conveyance mechanism 202 substantially as described above, using motors, tracks, and gears. However, the wafer tape conveyance mechanism 1202 may include a substantially static mechanism, in that, while the die 220 may be fed continuously through the transfer position by unrolling the substrate 1206 from reel 1204, the reel 1204 itself main remain in a fixed position. In some instances, the tension of the substrate 1206 may be maintained for stability purposes by tensioning rollers 1208, and/or a tensioning reel 1210, which may be disposed on a side of the apparatus 1200 opposite the reel 1204. The tensioning reel 1210 may roll up the substrate 1206 after the die have been transferred. Alternatively, the tension may be maintained by any other suitable means to secure the substrate 1206 so as to assist in pulling it through the transfer position after each transfer operation to cycle through the die 220.

In an embodiment where multiple reels 1204 are used, each reel 1204 may be disposed laterally adjacent to other reels 1204. Each reel 1204 may be paired with a specific transfer mechanism 206 and a specific fixing mechanism 208. In this case, each respective set of transfer mechanisms and fixing mechanisms may be arranged with respect to the product substrate 210 such that die may be placed in multiple locations on the same product substrate 210 simultaneously. For example, in some instances, the respective transfer positions (i.e., the alignment between a transfer mechanism and a corresponding fixing mechanism) may be in a line, offset, or staggered so as to accommodate various circuit trace patterns.

Regardless of whether one reel 1204 or a plurality of reels 1204 are implemented, the die transfer operation may be relatively similar to the transfer operation as described above with respect to the first example embodiment of the direct transfer apparatus 200. For instance, the product substrate 210 may be conveyed to a transfer position (die fixing position) in the same manner as described above via the product substrate conveyance mechanism 202, the transfer mechanism(s) 206 may perform a needle stroke to transfer the die 220 from the die substrate 1206 to the product substrate 210, and the fixing mechanism 208 may be actuated to assist in affixing the die 220 to the product substrate 210.

Note that in an embodiment with a plurality of reels 1204, a circuit trace pattern may be such that not every transfer mechanism may need to be actuated simultaneously. Accordingly, multiple transfer mechanisms may be actuated intermittently as the product substrate is conveyed to various positions for transfer.

Fourth Example Embodiment of a Direct Transfer Apparatus

Figure 13:
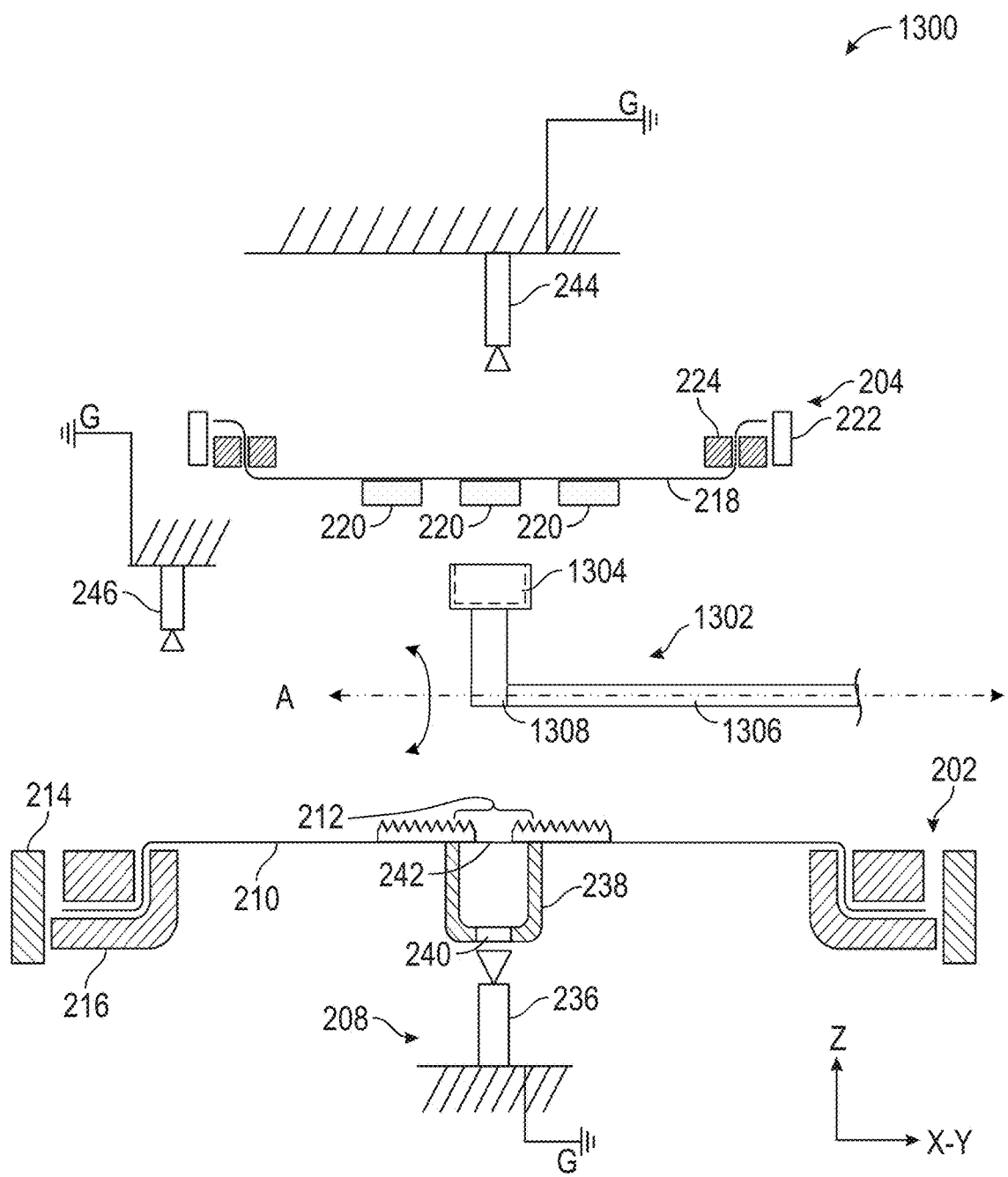
FIG. 13 illustrates a schematic view of another embodiment of a transfer apparatus in a pre-transfer position.

FIG. 13 depicts an embodiment of a direct transfer apparatus 1300. As in FIGS. 2A and 2B, the product substrate conveyance mechanism 202 may be disposed adjacent to the wafer tape conveyance mechanism 204. However, there is a space between the conveyance mechanisms 202, 204 in which a transfer mechanism 1302 may be disposed to effectuate the transfer of the die 220 from the wafer tape 218 to the product substrate 210.

The transfer mechanism 1302 may include a collet 1304 that picks the die 220, one or more at a time, from the wafer tape 218 and rotates about an axis A that extends through arm 1306. For example, FIG. 13 depicts the wafer tape 218 facing the product substrate 210 such that the collet 1304 may pivot 180 degrees about pivot point 1308 (see directional pivot arrows) between the die-carrying surface of the wafer tape 218 and the transfer surface of the product substrate 210. That is, the direction of extension of the collet 1304 pivots in a plane that is orthogonal to the surface or plane of transfer of both the wafer tape 218 and the product substrate 210. Alternatively, in some embodiments, the arm structure of the collet may be arranged to pivot between two parallel surfaces, and the arm of the collet may pivot along parallel plane. Thus, when facing the wafer tape 218, the collet 1304 may pick the die 220 and then immediately pivot to the surface of the product substrate 210 to be in line with the fixing mechanism 208. The collet 1304 then releases the die 220 so as to transfer the die 220 to be affixed to the circuit trace 212 on the product substrate 210.

In some instances, the transfer mechanism 1302 may include two or more collets (not shown) extending from the arm in different directions. In such an embodiment, the collets may be indexed rotatingly 360 degrees through the collet stop locations and picking and transferring die every time a collet passes the wafer tape 218.

Additionally, the one or more collets 1304 may pick and release the die 220 from the wafer tape using positive and negative vacuum pressure through the collet 1304.

Conclusion

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. A system to effectuate improved transfer of semiconductor die during a transfer operation, the system comprising:
   a first frame configured to secure a first substrate having the semiconductor die thereon;
   a second frame configured to secure a second substrate adjacent the first substrate;
   a needle disposed adjacent to the first frame, the needle including:
      a longitudinal surface extending in a direction toward the second frame, and
      a base end, a cross-sectional dimension of the base end being based, at least in part, on a cross-sectional dimension of the semiconductor die; and
   a needle actuator operably connected to the needle, the needle actuator configured to actuate the needle such that, during the transfer operation, when the first substrate is secured in the first frame and the second substrate is secured in the second frame, the needle presses the semiconductor die into contact with the second substrate so as to transfer the semiconductor die onto the second substrate.

2. The system of claim 1, wherein the second substrate includes a conductive trace, and
   wherein the needle actuator is configured to actuate the needle to press the semiconductor die into contact with the conductive trace and transfer the semiconductor die onto the second substrate.

3. The system of claim 1, wherein the needle further includes a tapered portion interposed between the longitudinal surface and the base end, and
   wherein a height of the tapered portion is greater than a distance traveled by the needle during the transfer operation.

4. The system of claim 3, wherein the needle includes a longitudinal central axis, and
   wherein an angle between the longitudinal central axis and the tapered portion is about 10 degrees to about 15 degrees.

5. The system of claim 1, wherein the needle further includes a radius of curvature interposed between the longitudinal surface and the base end, and
   wherein the radius of curvature is based, at least in part, on the cross-sectional dimension of the semiconductor die.

6. The system of claim 1, wherein the first substrate includes a first wafer tape, and
   wherein the second substrate includes at least one of a second wafer tape or a product substrate.

* * * * *